US012755935B2

(12) United States Patent
Bhowmick et al.

(10) Patent No.: US 12,755,935 B2
(45) Date of Patent: Oct. 6, 2026

(54) PROCESS CONTROL FOR ION ENERGY DELIVERY USING MULTIPLE GENERATORS AND PHASE CONTROL

(71) Applicant: Lam Research Corporation, Fremont, CA (US)

(72) Inventors: Ranadeep Bhowmick, San Jose, CA (US); Felix Kozakevich, Sunnyvale, CA (US); Alexei Marakhtanov, Albany, CA (US); John Holland, Fremont, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 19/054,590

(22) Filed: Feb. 14, 2025

(65) Prior Publication Data

US 2025/0191882 A1 Jun. 12, 2025

Related U.S. Application Data

(63) Continuation of application No. 18/010,204, filed as application No. PCT/US2021/040480 on Jul. 6, 2021, now Pat. No. 12,255,052.

(60) Provisional application No. 63/049,532, filed on Jul. 8, 2020.

(51) Int. Cl.
*H01J 37/32* (2006.01)

(52) U.S. Cl.
CPC .. *H01J 37/32165* (2013.01); *H01J 37/32128* (2013.01); *H01J 37/32183* (2013.01); *H01J 2237/3343* (2013.01)

(58) Field of Classification Search
CPC .......... H01J 37/32165; H01J 37/32128; H01J 37/32183; H01J 2237/3343; H01J 37/32174; H01L 21/6831; H01L 21/68742; H01L 21/67109
See application file for complete search history.

(56) References Cited

U.S. PATENT DOCUMENTS

| | | | | |
|---|---|---|---|---|
| 2017/0084429 | A1* | 3/2017 | Marakhtanov .... | H01J 37/32146 |
| 2017/0358431 | A1 | 12/2017 | Dorf et al. | |
| 2018/0005802 | A1* | 1/2018 | Chen ................. | H01J 37/32174 |
| 2018/0301320 | A1* | 10/2018 | Chen ................. | H01J 37/32183 |
| 2019/0318913 | A1 | 10/2019 | Yoshida et al. | |
| 2019/0333738 | A1 | 10/2019 | Coumou et al. | |
| 2021/0082667 | A1* | 3/2021 | Zhao ................... | H01J 37/3299 |

FOREIGN PATENT DOCUMENTS

| | | |
|---|---|---|
| JP | 2004-193564 A | 7/2004 |

* cited by examiner

*Primary Examiner* — Abdullah A Riyami
*Assistant Examiner* — Syed M Kaiser
(74) *Attorney, Agent, or Firm* — Polygon IP, LLP

(57) ABSTRACT

A method for applying RF power in a plasma process chamber is provided, including: generating a first RF signal; generating a second RF signal; generating a third RF signal; wherein the first, second, and third RF signals are generated at different frequencies; combining the first, second and third RF signals to generate a combined RF signal, wherein a wave shape of the combined RF signal is configured to approximate a sloped square wave shape; applying the combined RF signal to a chuck in the plasma process chamber.

19 Claims, 8 Drawing Sheets

Sine Wave
- Bow Exhibited

Square Wave
- Increased Bow

Sloped Square
Wave
- Reduced Bow

PROCESS CONTROL FOR ION ENERGY DELIVERY USING MULTIPLE GENERATORS AND PHASE CONTROL

CLAIM OF PRIORITY

This application is a continuation of and claims priority, under 35 U.S.C. § 120, to U.S. patent application Ser. No. 18/010,204, filed on Dec. 13, 2022, and titled "PROCESS CONTROL FOR ION ENERGY DELIVERY USING MULITPLE GENERATORS AND PHASE CONTROL", which is a national stage filing of and claims priority, under 35 U.S.C. § 371, to PCT/US21/40480, filed on Jul. 6, 2021, and titled "PROCESS CONTROL FOR ION ENERGY DELIVERY USING MULITPLE GENERATORS AND PHASE CONTROL", which claims the benefit of and priority, under 35 U.S.C. § 119 (e), to U.S. Provisional Patent Application No. 63/049,532, filed on Jul. 8, 2020, and titled "PROCESS CONTROL FOR ION ENERGY DELIVERY USINGMULITPLE GENERATORS AND PHASE CONTROL", all of which are incorporated herein by reference in their entirety.

Field

The present disclosure relates to semiconductor device fabrication.

BACKGROUND

Description of the Related Art

Plasma etching processes are often used in the manufacture of semiconductor devices on semiconductor wafers. In the plasma etching process, a semiconductor wafer that includes semiconductor devices under manufacture is exposed to a plasma generated within a plasma processing volume. The plasma interacts with material(s) on the semiconductor wafer so as to remove material(s) from the semiconductor wafer and/or modify material(s) to enable their subsequent removal from the semiconductor wafer. The plasma can be generated using specific reactant gases that will cause constituents of the plasma to interact with the material(s) to be removed/modified from the semiconductor wafer, without significantly interacting with other materials on the wafer that are not to be removed/modified. The plasma is generated by using radiofrequency signals to energize the specific reactant gases. These radiofrequency signals are transmitted through the plasma processing volume that contains the reactant gases, with the semiconductor wafer held in exposure to the plasma processing volume. The transmission paths of the radiofrequency signals through the plasma processing volume can affect how the plasma is generated within the plasma processing volume. For example, the reactant gases may be energized to a greater extent in regions of the plasma processing volume where larger amounts of radiofrequency signal power is transmitted, thereby causing spatial non-uniformities in the plasma characteristics throughout the plasma processing volume. The spatial non-uniformities in plasma characteristics can manifest as spatial non-uniformity in ion density, ion energy, and/or reactive constituent density, among other plasma characteristics. The spatial non-uniformities in plasma characteristics can correspondingly cause spatial non-uniformities in plasma processing results on the semiconductor wafer. Therefore, the manner in which radiofrequency signals are transmitted through the plasma processing volume can have an effect on the uniformity of plasma processing results on the semiconductor wafer. It is within this context that the present disclosure arises.

SUMMARY

Broadly speaking, embodiments of the present disclosure provide methods and systems to enable process control for ion energy delivery using multiple generators and phase control.

In some implementations, a method for applying RF power in a plasma process chamber is provided, including: generating a first RF signal; generating a second RF signal; generating a third RF signal; wherein the first, second, and third RF signals are generated at different frequencies; combining the first, second and third RF signals to generate a combined RF signal, wherein a wave shape of the combined RF signal is configured to approximate a sloped square wave shape; applying the combined RF signal to a chuck in the plasma process chamber.

In some implementations, the first RF signal is generated at a fundamental frequency; wherein the second RF signal is generated at a first predefined harmonic frequency of the fundamental frequency; wherein the third RF signal is generated at a second predefined harmonic frequency of the fundamental frequency.

In some implementations, the first or second predefined harmonic frequency is an even or odd harmonic of the fundamental frequency.

In some implementations, generating the second RF signal includes adjusting a phase of the second RF signal relative to a phase of the first RF signal; wherein generating the third RF signal includes adjusting a phase of the third RF signal relative to the phase of the first RF signal; wherein the adjusting of the phases of the second and third RF signals adjusts an amount of sloping of the wave shape of the combined RF signal.

In some implementations, the wave shape of the combined RF signal is configured to compensate for a capacitance of the chuck, so that the combined RF signal that reaches a wafer supported by the chuck has a wave shape that approximates a non-sloped square wave shape.

In some implementations, the wave shape of the combined RF signal is configured to concentrate an ion energy distribution function of ions directed from a plasma by the application of the combined RF signal.

In some implementations, the concentrating of the ion energy distribution function increases directionality of the ions and reduces bowing of features etched by the ions.

In some implementations, the wave shape of the combined RF signal is configured so that peak portions of the wave shape exhibit a positive slope and trough portions of the wave shape exhibit a negative slope.

In some implementations, the wave shape of the combined RF signal is configured to ensure verticality of high aspect ratio features during etching.

In some implementations, the first RF signal is generated at a frequency in the range of about 50 to 500 KHz.

In some implementations, a system for applying RF power in a plasma process chamber is provided, including: a first generator that generates a first RF signal; a second generator that generates a second RF signal; a third generator that generates a third RF signal; wherein the first, second, and third RF signals are generated at different frequencies; wherein the first, second and third RF signals are combined to generate a combined RF signal, wherein a wave shape of the combined RF signal is configured to approximate a sloped square wave shape; the combined RF signal is configured to be applied to a chuck in the plasma process chamber.

In some implementations, the first RF signal is generated at a fundamental frequency; wherein the second RF signal is generated at a first predefined harmonic frequency of the fundamental frequency; wherein the third RF signal is generated at a second predefined harmonic frequency of the fundamental frequency.

In some implementations, the first or second predefined harmonic frequency is an even or odd harmonic of the fundamental frequency.

In some implementations, the second RF signal is generated by adjusting a phase of the second RF signal relative to a phase of the first RF signal; wherein the third RF signal is generated by adjusting a phase of the third RF signal relative to the phase of the first RF signal; wherein the adjusting of the phases of the second and third RF signals adjusts an amount of sloping of the wave shape of the combined RF signal.

In some implementations, the wave shape of the combined RF signal is configured to compensate for a capacitance of the chuck, so that the combined RF signal that reaches a wafer supported by the chuck has a wave shape that approximates a non-sloped square wave shape.

In some implementations, the wave shape of the combined RF signal is configured to concentrate an ion energy distribution function of ions directed from a plasma by the application of the combined RF signal.

In some implementations, the concentrating of the ion energy distribution function increases directionality of the ions and reduces bowing of features etched by the ions.

In some implementations, the wave shape of the combined RF signal is configured so that peak portions of the wave shape exhibit a positive slope and trough portions of the wave shape exhibit a negative slope.

In some implementations, the wave shape of the combined RF signal is configured to ensure verticality of high aspect ratio features during etching.

In some implementations, the first RF signal is generated at a frequency in the range of about 50 to 500 kHz.

In some implementations, the system further includes: an impedance matching system that combines the first, second and third RF signals to generate the combined RF signal.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

In plasma etching systems for semiconductor wafer fabrication, such as in systems described herein, the semiconductor wafer is positioned on an electrode from which radiofrequency signals emanate to generate a plasma within a plasma generation region overlying the semiconductor wafer, with the plasma having characteristics controlled to cause a prescribed etching process to occur on the semiconductor wafer. To achieve improved anisotropic etching of high aspect ratio features without unwanted bowing effects, high energy ions that are also highly directionally coherent are sought. However, it has been challenging to achieve such narrow ion energy distributions at high energies, as high voltages are employed to generate such high energy ions, and to date, industry has struggled to produce a narrow ion energy distribution that provides high energy ions with a narrow angular distribution that is ideal for ensuring verticality of high aspect ratio etch.

Figure 1:
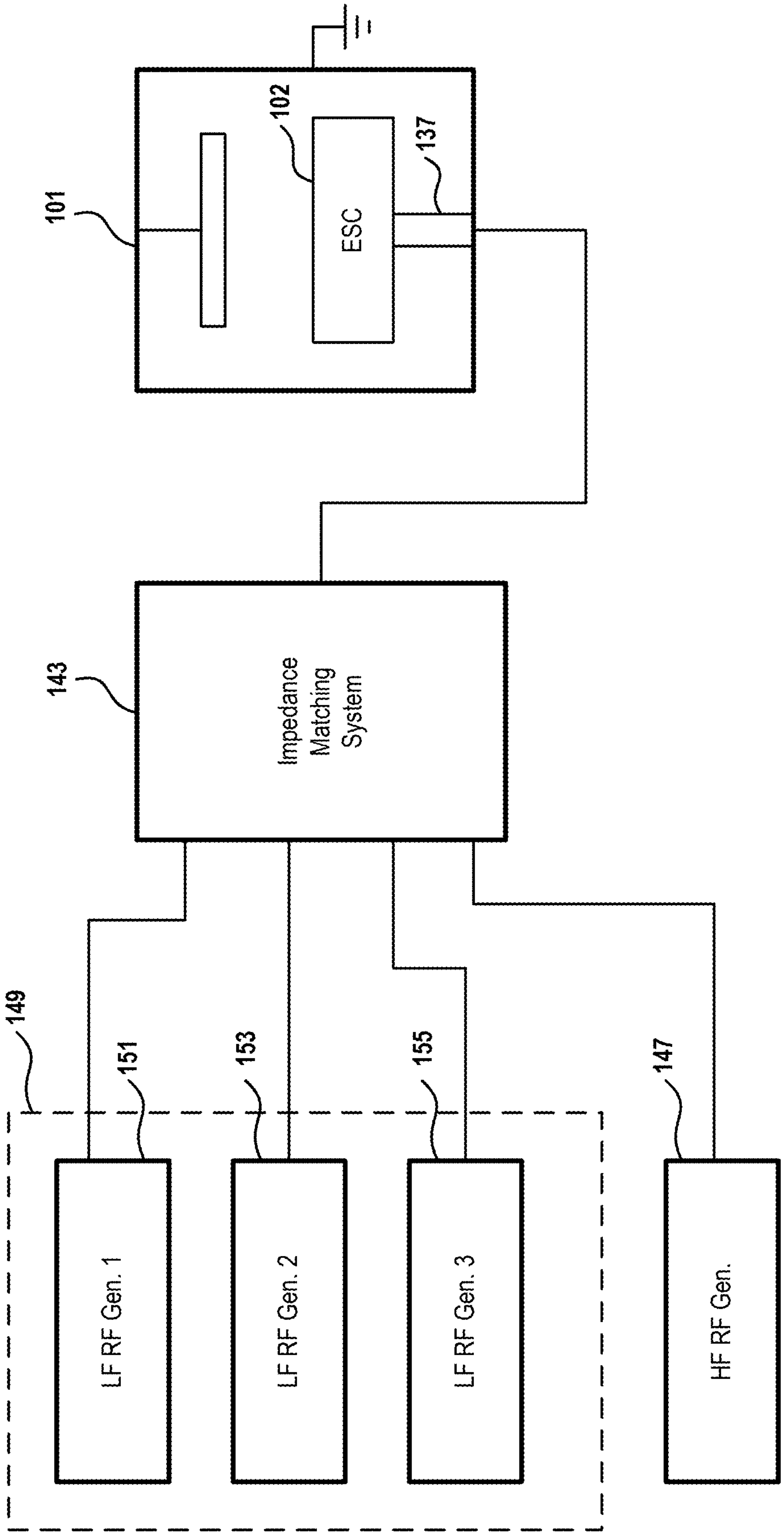
FIG. 1 conceptually illustrates a portion of a plasma processing system 100 for use in semiconductor chip manufacturing, in accordance with implementations of the disclosure.

FIG. 1 conceptually illustrates a portion of a plasma processing system 100 for use in semiconductor chip manufacturing, in accordance with implementations of the disclosure. The plasma processing system 100 includes a chamber 101 in which plasma processing is performed on a substrate, e.g. a wafer W in some implementations. An electrostatic chuck (ESC) 102 is disposed in the chamber 101 and configured to support the wafer W during processing. More specifically, the ESC 102 can include an electrode 109 (shown at FIG. 2) which receives high frequency and low frequency RF power, as described in further detail below, and which in some embodiments, is formed of aluminum. A ceramic layer 110 (shown at FIG. 2) can be formed on a top surface of the electrode 109, with the ceramic layer 110 of the ESC 102 configured to receive and support the wafer W during performance of plasma processing operations on the wafer W. It will be appreciated that in some implementations, the ceramic layer 110, the electrode 109, and associated components in the chamber 101 define the electrostatic chuck (ESC) 102.

A first radiofrequency (RF) signal generator 147 (or high frequency RF generator; e.g. ~60 MHz) is configured to provide high frequency RF power, via an impedance matching system 143, to the electrode 109. A second radiofrequency signal generator 149 (or low frequency RF subsystem which includes a plurality of individual low frequency RF generators; e.g. ~400 kHz) is configured to provide low frequency RF power, via the impedance matching system 143, to the electrode 109. The application of radiofrequency power into gaseous species introduced in the process space above the wafer, produces plasma 180 for wafer processing, such as for etching.

In plasma processing for reactive ion etch (RIE), a significant challenge is how to achieve high ion energies with a narrow ion energy distribution. A narrow distribution of high energy ions is desirable because it provides for a narrow angular distribution of the ions, as high energy ions accelerated in the same direction are less subject to scattering. Thus, a narrow high energy ion source provides more directional ions to enable etching of higher aspect ratio features, as the ions are less likely to attack sidewalls of features and cause unwanted bowing within etched features.

In view of the above, it has been discovered that a sloped square waveform produced by the low frequency RF subsystem 149 can provide a narrow distribution of high energy ions for etching. In order to approximate a sloped square waveform, in accordance with implementations of the disclosure, the low frequency RF subsystem 149 can include at least three separate low frequency RF generators 151, 153, and 155, that each generate individual RF signals, which are configured, when combined, to provide (at least approximately) the sloped square waveform. In some implementations, one or more of the individual RF signals generated by each of the separate low frequency RF generators 151, 153, and 155 is a sinusoidal RF signal. Furthermore, in some implementations the RF signal generated by the first low frequency RF generator 151 is generated at a fundamental frequency, and the RF signals generated by the second and third low frequency RF generators 153 and 155 are harmonics of the fundamental frequency. In some implementations, the phases of the individual RF signals are adjusted so as to adjust the slope of the sloped square waveform. For example, the phases of the harmonics are adjusted relative to the fundamental frequency, so that a phase offset of each harmonic from the fundamental frequency is configured to provide for the sloped square waveform when the individual RF signals are combined. Additionally, the weights of the various waveforms are also adjusted to provide the desired final waveform shape.

As described in further detail below, but without being bound by any particular theory of operation, it is believed that the slope of the sloped square waveform is configured to compensate for the charge of the ceramic of the ESC 102 (and some stray capacitance), thereby optimizing the ion energy distribution and ion angular distribution. The capacitance of the ESC 102 tends to reduce the potential at the wafer as compared to the potential which is applied at the RF signal supply rod 137, due to a "charging of the capacitor" effect resulting from the capacitance of the ESC 102. In other words, the potential from the applied RF that reaches the wafer is diminished over the course of a wave cycle due to the ESC capacitance. This causes the potential difference between the plasma and the wafer W to vary over the course of a given RF cycle as the charging of the capacitor reduces the potential on the wafer. The result is the production of a wider, more diffuse, ion energy distribution with more intermediate energy ions, and consequently a wider angular distribution of the ions, which is not conducive to etching high aspect ratio features.

Figure 2:
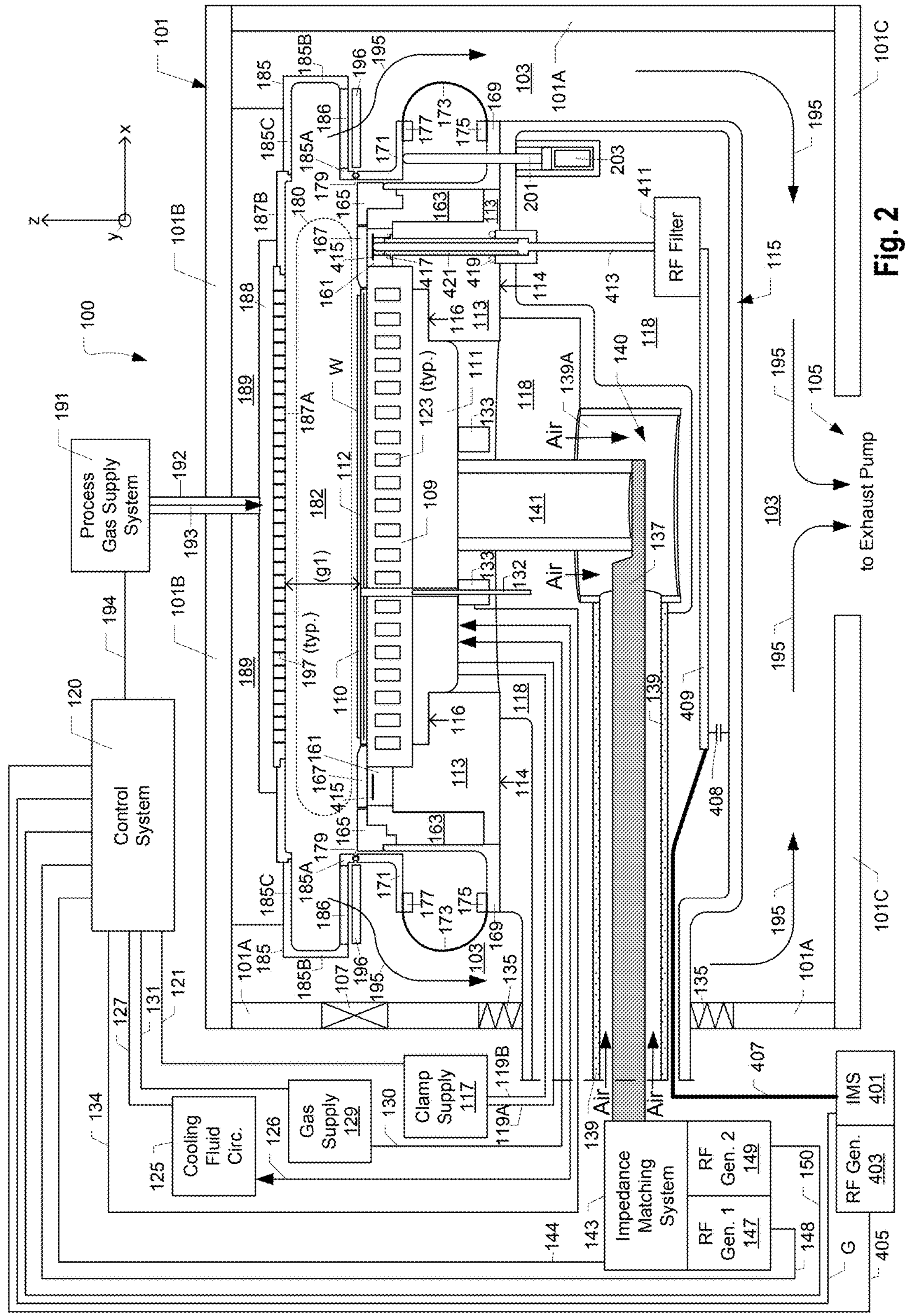
FIG. 2 shows a vertical cross-section view through a plasma processing system for use in semiconductor chip manufacturing, in accordance with some embodiments.

FIG. 2 shows a vertical cross-section view through a plasma processing system 100 for use in semiconductor chip manufacturing, in accordance with some embodiments. The system 100 includes a chamber 101 formed by walls 101A, a top member 101B, and a bottom member 101C. The walls 101A, top member 101B, and bottom member 101C collectively form an interior region 103 within the chamber 101. The bottom member 101C includes an exhaust port 105 through which exhaust gases from plasma processing operations are directed. In some embodiments, during operation, a suction force is applied at the exhaust port 105, such as by a turbo pump or other vacuum device, to draw process exhaust gases out of the interior region 103 of the chamber 101. In some embodiments, the chamber 101 is formed of aluminum. However, in various embodiments, the chamber 101 can be formed of essentially any material that provides sufficient mechanical strength, acceptable thermal performance, and is chemically compatible with the other materials to which it interfaces and to which it is exposed during plasma processing operations within the chamber 101, such as stainless steel, among others. At least one wall 101A of the chamber 101 includes a door 107 through which a semiconductor wafer W is transferred into and out of the chamber 101. In some embodiments, the door 107 is configured as a slit-valve door.

In some embodiments, the semiconductor wafer W is a semiconductor wafer undergoing a fabrication procedure. For ease of discussion, the semiconductor wafer W is referred to as wafer W hereafter. However, it should be understood that in various embodiments, the wafer W can be essentially any type of substrate that is subjected to a plasma-based fabrication process. For example, in some embodiments, the wafer W as referred to herein can be a substrate formed of silicon, sapphire, GaN, GaAs or SiC, or other substrate materials, and can include glass panels/substrates, metal foils, metal sheets, polymer materials, or the like. Also, in various embodiments, the wafer W as referred to herein may vary in form, shape, and/or size. For example, in some embodiments, the wafer W referred to herein may correspond to a circular-shaped semiconductor wafer on which integrated circuit devices are manufactured. In various embodiments, the circular-shaped wafer W can have a diameter of 200 mm (millimeters), 300 mm, 450 mm, or of another size. Also, in some embodiments, the wafer W referred to herein may correspond to a non-circular substrate, such as a rectangular substrate for a flat panel display, or the like, among other shapes.

The plasma processing system 100 includes an electrode 109 positioned on a facilities plate 111. In some embodiments, the electrode 109 and the facilities plate 111 are formed of aluminum. However, in other embodiments, the electrode 109 and the facilities plate 111 can be formed of another electrically conductive material that has sufficient mechanical strength and that has compatible thermal and chemical performance characteristics. A ceramic layer 110 is formed on a top surface of the electrode 109. In some embodiments, the ceramic layer has a vertical thickness of about 1.25 millimeters (mm), as measured perpendicular to the top surface of the electrode 109. However, in other embodiments, the ceramic layer 110 can have a vertical thickness that is either greater than or less than 1.25 mm. The ceramic layer 110 is configured to receive and support the wafer W during performance of plasma processing operations on the wafer W. In some embodiments, the top surface of the electrode 190 that is located radially outside of the ceramic layer 110 and the peripheral side surfaces of the electrode 109 are covered with a spray coat of ceramic.

The ceramic layer 110 includes an arrangement of one or more clamp electrodes 112 for generating an electrostatic force to hold the wafer W to the top surface of the ceramic layer 110. In some embodiments, the ceramic layer 110 includes an arrangement of two clamp electrodes 112 that operate in a bipolar manner to provide a clamping force to the wafer W. The clamp electrodes 112 are connected to a direct current (DC) supply 117 that generates a controlled clamping voltage to hold the wafer W against the top surface of the ceramic layer 110. Electrical wires 119A, 119B are connected between the DC supply 117 and the facilities plate 111. Electrical wires/conductors are routed through the facilities plate 111 and the electrode 109 to electrically connect the wires 119A, 119B to the clamp electrodes 112. The DC supply 117 is connected to a control system 120 through one or more signal conductors 121.

The electrode 109 also includes an arrangement of temperature control fluid channels 123 through which a temperature control fluid is flowed to control a temperature of the electrode 109 and in turn control a temperature of the wafer W. The temperature control fluid channels 123 are plumbed (fluidly connected) to ports on the facilities plate 111. Temperature control fluid supply and return lines are connected to these ports on the facilities plate 111 and to a temperature control fluid circulation system 125, as indicated by arrow 126. The temperature control fluid circulation system 125 includes a temperature control fluid supply, a temperature control fluid pump, and a heat exchanger, among other devices, to provide a controlled flow of temperature control fluid through the electrode 109 in order to obtain and maintain a prescribed wafer W temperature. The temperature control fluid circulation system 125 is connected to the control system 120 through one or more signal conductors 127. In various embodiments, various types of temperature control fluid can be used, such as water or a refrigerant liquid/gas. Also, in some embodiments, the temperature control fluid channels 123 are configured to enable spatially varying control of the temperature of the wafer W, such as in two dimensions (x and y) across the wafer W.

The ceramic layer 110 also includes an arrangement of backside gas supply ports (not shown) that are fluidly connected to corresponding backside gas supply channels within the electrode 109. The backside gas supply channels within the electrode 109 are routed through the electrode 109 to the interface between the electrode 109 and the facilities plate 111. One or more backside gas supply line(s) are connected to ports on the facilities plate 111 and to a backside gas supply system 129, as indicated by arrow 130. The facilities plate 111 is configured to supply the backside gas(es) from the one or more backside gas supply line(s) to the backside gas supply channels within the electrode 109. The backside gas supply system 129 includes a backside gas supply, a mass flow controller, and a flow control valve, among other devices, to provide a controlled flow of backside gas through the arrangement of backside gas supply ports in the ceramic layer 110. In some embodiments, the backside gas supply system 129 also includes one or more components for controlling a temperature of the backside gas. In some embodiments, the backside gas is helium. Also, in some embodiments, the backside gas supply system 129 can be used to supply clean dry air (CDA) to the arrangement of backside gas supply ports in the ceramic layer 110. The backside gas supply system 129 is connected to the control system 120 through one or more signal conductors 131.

Three lift pins 132 extend through the facilities plate 111, the electrode 109, and the ceramic layer 110 to provide for vertical movement of the wafer W relative to the top surface of the ceramic layer 110. In some embodiments, vertical movement of the lift pins 132 is controlled by a respective electromechanical and/or pneumatic lifting device 133 connected to the facilities plate 111. The three lifting devices 133 are connected to the control system 120 through one or more signal conductors 134. In some embodiments, the three lift pins 132 are positioned to have a substantially equal azimuthal spacing about a vertical centerline of the electrode 109/ceramic layer 110 that extends perpendicular to the top surface of the ceramic layer 110. It should be understood that the lift pins 132 are raised to receive the wafer W into the chamber 101 and to remove the wafer W from the chamber 101. Also, the lift pins 132 are lowered to allow the wafer W to rest on the top surface of the ceramic layer 110 during processing of the wafer W.

Also, in various embodiments, one or more of the electrode 109, the facilities plate 111, the ceramic layer 110, the clamp electrodes 112, the lift pins 132, or essentially any other component associated therewith can be equipped to include one or more sensors, such as sensors for temperature measurement, electrical voltage measurement, and electrical current measurement, among others. Any sensor disposed within the electrode 109, the facilities plate 111, the ceramic layer 110, the clamp electrodes 112, the lift pins 132, or essentially any other component associated therewith is connected to the control system 120 by way of electrical wire, optical fiber, or through a wireless connection.

The facilities plate 111 is set within an opening of a ceramic support 113, and is supported by the ceramic support 113. The ceramic support 113 is positioned on a supporting surface 114 of a cantilever arm assembly 115. In some embodiments, the ceramic support 113 has a substantially annular shape, such that the ceramic support 113 substantially circumscribes the outer radial perimeter of the facilities plate 111, while also providing a supporting surface 116 upon which a bottom outer peripheral surface of the facilities plate 111 rests. The cantilever arm assembly 115 extends through the wall 101A of the chamber 101. In some embodiments, a sealing mechanism 135 is provided within the wall 101A of the chamber 101 where the cantilever arm assembly 115 is located to provide for sealing of the interior region 103 of the chamber 101, while also enabling the cantilever arm assembly 115 to move upward and downward in the z-direction in a controlled manner.

The cantilever arm assembly 115 has an open region 118 through which various devices, wires, cables, and tubing is routed to support operations of the system 100. The open region 118 within the cantilever arm assembly is exposed to ambient atmospheric conditions outside of the chamber 101, e.g., air composition, temperature, pressure, and relative humidity. Also, a radiofrequency signal supply rod 137 is positioned inside of the cantilever arm assembly 115. More specifically, the radiofrequency signal supply rod 137 is positioned inside of an electrically conductive tube 139, such that the radiofrequency signal supply rod 137 is spaced apart from the inner wall of the tube 139. The sizes of the radiofrequency signal supply rod 137 and the tube 139 may vary. The region inside of the tube 139 between the inner wall of the tube 139 and the radiofrequency signal supply rod 137 is occupied by air along the full length of the tube 139. In some embodiments, the outer diameter ($D_{rod}$) of the radiofrequency signal supply rod 137 and the inner diameter of the tube 139 ($D_{tube}$) are set to satisfy the relationship $\ln(D_{tube}/D_{rod})>=e^1$.

In some embodiments, the radiofrequency signal supply rod 137 is substantially centered within the tube 139, such that a substantially uniform radial thickness of air exists between the radiofrequency signal supply rod 137 and the inner wall of the tube 139, along the length of tube 139. However, in some embodiments, the radiofrequency signal supply rod 137 is not centered within the tube 139, but the air gap within the tube 139 exists at all locations between the radiofrequency signal supply rod 137 and the inner wall of the tube 139, along the length of the tube 139. A delivery end of the radiofrequency signal supply rod 137 is electrically and physically connected to a lower end of a radiofrequency signal supply shaft 141. In some embodiments, the delivery end of the radiofrequency signal supply rod 137 is bolted to a lower end of a radiofrequency signal supply shaft 141. An upper end of the radiofrequency signal supply shaft 141 is electrically and physically connected to the bottom of the facilities plate 111. In some embodiments, the upper end of the radiofrequency signal supply shaft 141 is bolted to the bottom of the facilities plate 111. In some embodiments, both the radiofrequency signal supply rod 137 and the radiofrequency signal supply shaft 141 are formed of copper. In some embodiments, the radiofrequency signal supply rod 137 is formed of copper, or aluminum, or anodized aluminum. In some embodiments, the radiofrequency signal supply shaft 141 is formed of copper, or aluminum, or anodized aluminum. In other embodiments, the radiofrequency signal supply rod 137 and/or the radiofrequency signal supply shaft 141 is formed of another electrically conductive material that provides for transmission of radiofrequency electrical signals. In some embodiments, the radiofrequency signal supply rod 137 and/or the radiofrequency signal supply shaft 141 is coated with an electrically conductive material (such as silver or another electrically conductive material) that provides for transmission of radiofrequency electrical signals. Also, in some embodiments, the radiofrequency signal supply rod 137 is a solid rod. However, in other embodiments, the radiofrequency signal supply rod 137 is a tube. Also, it should be understood that a region 140 surrounding the connection between the radiofrequency signal supply rod 137 and the radiofrequency signal supply shaft 141 is occupied by air.

A supply end of the radiofrequency signal supply rod 137 is connected electrically and physically to an impedance matching system 143. The impedance matching system 143 is connected to a first radiofrequency signal generator 147 and a low frequency RF subsystem 149. The impedance matching system 143 is also connected to the control system 120 through one or more signal conductors 144. The first radiofrequency signal generator 147 is also connected to the control system 120 through one or more signal conductors 148. The low frequency RF subsystem 149 is also connected to the control system 120 through one or more signal conductors 150. The impedance matching system 143 includes an arrangement of inductors and capacitors sized and connected to provide for impedance matching so that radiofrequency power can be transmitted along the radiofrequency signal supply rod 137, along the radiofrequency signal supply shaft 141, through the facilities plate 111, through the electrode 109, and into a plasma processing region 182 above the ceramic layer 110. In some embodiments, the first radiofrequency signal generator 147 is a high frequency radiofrequency signal generator, and the low frequency RF subsystem 149 is a low frequency radiofrequency signal generator. In some implementations, the low frequency RF subsystem 149 may include three or more individual signal generators whose signals/waveforms are combined to generate the low frequency RF signal that is produced by the low frequency RF subsystem 149 in accordance with principles described herein. In some embodiments, the first radiofrequency signal generator 147 generates radiofrequency signals within a range extending from about 50 MegaHertz (MHz) to about 70 MHz, or within a range extending from about 54 MHz to about 63 MHz, or at about 60 MHz. In some embodiments, the first radiofrequency signal generator 147 supplies radiofrequency power within a range extending from about 5 kiloWatts (kW) to about 25 kW, or within a range extending from about 10 kW to about 20 kW, or within a range extending from about 15 kW to about 20 kW, or of about 10 kW, or of about 16 kW. In some embodiments, the low frequency RF subsystem 149 generates radiofrequency signals within a range extending from about 50 kiloHertz (kHz) to about 500 kHz, or within a range extending from about 330 kHz to about 440 kHz, or at about 400 kHz. In some embodiments, the low frequency RF subsystem 149 supplies radiofrequency power within a range extending from about 15 kW to about 100 kW, or within a range extending from about 30 kW to about 50 kW, or of about 34 kW, or of about 50 kW. In an example embodiment, the first radiofrequency signal generator 147 is set to generate radiofrequency signals having a frequency of about 60 MHz, and the low frequency RF subsystem 149 is set to generate radiofrequency signals having a frequency of about 400 kHz.

A coupling ring 161 is configured and positioned to extend around the outer radial perimeter of the electrode 109. In some embodiments, the coupling ring 161 is formed of a ceramic material. A quartz ring 163 is configured and positioned to extend around the outer radial perimeters of both the coupling ring 161 and the ceramic support 113. In some embodiments, the coupling ring 161 and the quartz ring 163 are configured to have substantially aligned top surfaces when the quartz ring 163 is positioned around both the coupling ring 161 and the ceramic support 113. Also, in some embodiments, the substantially aligned top surfaces of the coupling ring 161 and the quartz ring 163 are substantially aligned with a top surface of the electrode 109, said top surface being present outside of the radial perimeter of the ceramic layer 110. Also, in some embodiments, a cover ring 165 is configured and positioned to extend around the outer radial perimeter of the top surface of the quartz ring 163. In some embodiments, the cover ring 165 is formed of quartz. In some embodiments, the cover ring 165 is configured to extend vertically above the top surface of the quartz ring 163. In this manner, the cover ring 165 provides a peripheral boundary within which an edge ring 167 is positioned.

The edge ring 167 is configured to facilitate extension of the plasma sheath radially outward beyond the peripheral edge of the wafer W to provide improvement in process results near the periphery of the wafer W. In various embodiments, the edge ring 167 is formed of a conductive material, such as crystalline silicon, polycrystalline silicon (polysilicon), boron doped single crystalline silicon, aluminum oxide, quartz, aluminum nitride, silicon nitride, silicon carbide, or a silicon carbide layer on top of an aluminum oxide layer, or an alloy of silicon, or a combination thereof, among other materials. It should be understood that the edge ring 167 is formed as an annular-shaped structure, e.g., as a ring-shaped structure. The edge ring 167 can perform many functions, including shielding components underlying the edge ring 167 from being damaged by ions of a plasma 180 formed within a plasma processing region 182. Also, the edge ring 167 improves uniformity of the plasma 180 at and along the outer peripheral region of the wafer W.

A fixed outer support flange 169 is attached to the cantilever arm assembly 115. The fixed outer support flange 169 is configured to extend around an outer vertical side surface of the ceramic support 113, and around an outer vertical side surface of the quartz ring 163, and around a lower outer vertical side surface of the cover ring 165. The fixed outer support flange 169 has an annular shape that circumscribes the assembly of the ceramic support 113, the quartz ring 163, and the cover ring 165. The fixed outer support flange 169 has an L-shaped vertical cross-section that includes a vertical portion and a horizontal portion. The vertical portion of the L-shaped cross-section of the fixed outer support flange 169 has an inner vertical surface that is positioned against the outer vertical side surface of the ceramic support 113, and against the outer vertical side surface of the quartz ring 163, and against the lower outer vertical side surface of the cover ring 165. In some embodiments, the vertical portion of the L-shaped cross-section of the fixed outer support flange 169 extends over an entirety of the outer vertical side surface of the ceramic support 113, and over an entirety of the outer vertical side surface of the quartz ring 163, and over the lower outer vertical side surface of the cover ring 165. In some embodiments, the cover ring 165 extends radially outward above a top surface of the vertical portion of the L-shaped cross-section of the fixed outer support flange 169. And, in some embodiments, an upper outer vertical side surface of the cover ring 165 (located above the top surface of the vertical portion of the L-shaped cross-section of the fixed outer support flange 169) is substantially vertically aligned with an outer vertical surface of the vertical portion of the L-shaped cross-section of the fixed outer support flange 169. The horizontal portion of the L-shaped cross-section of the fixed outer support flange 169 is positioned on and fastened to the supporting surface 114 of a cantilever arm assembly 115. The fixed outer support flange 169 is formed of an electrically conductive material. In some embodiments, the fixed outer support flange 169 is formed of aluminum or anodized aluminum. However, in other embodiments, the fixed outer support flange 169 can be formed of another electrically conductive material, such as copper or stainless steel. In some embodiments, the horizontal portion of the L-shaped cross-section of the fixed outer support flange 169 is bolted to the supporting surface 114 of a cantilever arm assembly 115.

An articulating outer support flange 171 is configured and positioned to extend around the outer vertical surface 169D of the vertical portion of the L-shaped cross-section of the fixed outer support flange 169, and to extend around the upper outer vertical side surface of the cover ring 165. The articulating outer support flange 171 has an annular shape that circumscribes both the vertical portion of the L-shaped vertical cross-section of the fixed outer support flange 169 and the upper outer vertical side surface of the cover ring 165. The articulating outer support flange 171 has an L-shaped vertical cross-section that includes a vertical portion and a horizontal portion. The vertical portion of the L-shaped cross-section of the articulating outer support flange 171 has an inner vertical surface that is positioned proximate to and spaced apart from both the outer vertical side surface of the vertical portion of the L-shaped cross-section of the fixed outer support flange 169 and the upper outer vertical side surface of the cover ring 165. In this manner, the articulating outer support flange 171 is moveable in the vertical direction (z-direction) along both the vertical portion of the L-shaped vertical cross-section of the fixed outer support flange 169 and the upper outer vertical side surface of the cover ring 165. The articulating outer support flange 171 is formed of an electrically conductive material. In some embodiments, the articulating outer support flange 171 is formed of aluminum or anodized aluminum. However, in other embodiments, the articulating outer support flange 171 can be formed of another electrically conductive material, such as copper or stainless steel.

A number of electrically conductive straps 173 are connected between the articulating outer support flange 171 and the fixed outer support flange 169, around the outer radial perimeters of both the articulating outer support flange 171 and the fixed outer support flange 169. In the example embodiment, the electrically conductive straps 173 are shown to have an "outward" configuration, in that the electrically conductive straps 173 bend outward away from the fixed outer support flange 169. In some embodiments, the electrically conductive straps 173 are formed of stainless steel. However, in other embodiments, the electrically conductive straps 173 can be formed of another electrically conductive material, such as aluminum or copper, among others.

In some embodiments, a number of electrically conductive straps 173 are distributed in a substantially equally spaced manner around the outer radial perimeters of the articulating outer support flange 171 and the fixed outer support flange 169. It should be understood, however, that the number of electrically conductive straps 173 can vary in different embodiments. In some embodiments, the number of electrically conductive straps 173 is within a range extending from about 24 to about 80, or within a range extending from about 36 to about 60, or within a range extending from about 40 to about 56. In some embodiments, the number of electrically conductive straps 173 is less than 24. In some embodiments, the number of electrically conductive straps 173 is greater than 80. Because the number of electrically conductive straps 173 has an effect on the ground return paths for the radiofrequency signals around the perimeter of the plasma processing region 182, the number of electrically conductive straps 173 can have an effect on the uniformity of process results across the wafer W. Also, the size of the electrically conductive straps 173 can vary in different embodiments.

In some embodiments, the electrically conductive straps 173 are connected to the fixed outer support flange 169 by a clamping force applied by securing a clamp ring 175 to a top surface of the horizontal portion of the L-shaped cross-section of the fixed outer support flange 169. In some embodiments, the clamp ring 175 is bolted to the fixed outer support flange 169. In some embodiments, the bolts that secure the clamp ring 175 to the fixed outer support flange 169 are positioned at locations between the electrically conductive straps 173. However, in some embodiments, one or more bolts that secure the clamp ring 175 to the fixed outer support flange 169 can be positioned to extend through electrically conductive straps 173. In some embodiments, the clamp ring 175 is formed of a same material as the fixed outer support flange 169. However, in other embodiments, the clamp ring 175 and the fixed outer support flange 169 can be formed of different materials.

In some embodiments, the electrically conductive straps 173 are connected to the articulating outer support flange 171 by a clamping force applied by securing a clamp ring 177 to a bottom surface of the horizontal portion of the L-shaped cross-section of the articulating outer support flange 171. Alternatively, in some embodiments, the first end portion of each of the plurality of electrically conductive straps 173 is connected to the upper surface of the horizontal portion of the articulating outer support flange 171 by the clamp ring 177. In some embodiments, the clamp ring 177 is bolted to the articulating outer support flange 171. In some embodiments, the bolts that secure the clamp ring 177 to the articulating outer support flange 171 are positioned at locations between the electrically conductive straps 173. However, in some embodiments, one or more bolts that secure the clamp ring 177 to the articulating outer support flange 171 can be positioned to extend through electrically conductive straps 173. In some embodiments, the clamp ring 177 is formed of a same material as the articulating outer support flange 171. However, in other embodiments, the clamp ring 177 and the articulating outer support flange 171 can be formed of different materials.

A set of support rods 201 are positioned around the cantilever arm assembly 115 to extend vertically through the horizontal portion 169B of the L-shaped cross-section of the fixed outer support flange 169. The upper end of the support rods 201 are configured to engage with the bottom surface of the horizontal portion of the L-shaped cross-section of the articulating outer support flange 171. In some embodiments, a lower end of each of the support rods 201 is engaged with a resistance mechanism 203. The resistance mechanism 203 is configured to provide an upward force to the corresponding support rod 201 that will resist downward movement of the support rod 201, while allowing some downward movement of the support rod 201. In some embodiments, the resistance mechanism 203 includes a spring to provide the upward force to the corresponding support rod 201. In some embodiments, the resistance mechanism 203 includes a material, e.g., spring and/or rubber, that has a sufficient spring constant to provide the upward force to the corresponding support rod 201. It should be understood that as the articulating outer support flange 171 moves downward to engage the set of support rods 201, the set of support rods 201 and corresponding resistance mechanisms 203 provide an upward force to the articulating outer support flange 171. In some embodiments, the set of support rods 201 includes three support rods 201 and corresponding resistance mechanisms 203. In some embodiments, the support rods 201 are positioned to have a substantially equal azimuthal spacing relative to a vertical centerline of the electrode 109. However, in other embodiments, the support rods 201 are positioned to have a non-equal azimuthal spacing relative to a vertical centerline of the electrode 109. Also, in some embodiments, more than three support rods 201 and corresponding resistance mechanisms 203 are provided to support the articulating outer support flange 171.

With continued reference back FIG. 2, the plasma processing system 100 further includes a C-shroud member 185 positioned above the electrode 109. The C-shroud member 185 is configured to interface with the articulating outer support flange 171. Specifically, a seal 179 is disposed on the top surface of the horizontal portion of the L-shaped cross-section of the articulating outer support flange 171, such that the seal 179 is engaged by the C-shroud member 185 when the articulating outer support flange 171 is moved upward toward the C-shroud member 185. In some embodiments, the seal 179 is electrically conductive to assist with establishing electrical conduction between the C-shroud member 185 and the articulating outer support flange 171. In some embodiments, the C-shroud member 185 is formed of polysilicon. However, in other embodiments, the C-shroud member 185 is formed of another type of electrically conductive material that is chemically compatible with the processes to be formed in the plasma processing region 182, and that has sufficient mechanical strength.

The C-shroud is configured to extend around the plasma processing region 182 and provide a radial extension of the plasma processing region 182 volume into the region defined within the C-shroud member 185. The C-shroud member 185 includes a lower wall 185A, an outer vertical wall 185B, and an upper wall 185C. In some embodiments, the outer vertical wall 185B and the upper wall 185C of the C-shroud member 185 are solid, non-perforated members, and the lower wall 185A of the C-shroud member 185 includes a number of vents 186 through which process gases flow from within the plasma processing region 182. In some embodiments, a throttle member 196 is disposed below the vents 186 of the C-shroud member 185 to control a flow of process gas through the vents 186. More specifically, in some embodiments, the throttle member 196 is configured to move up and down vertically in the z-direction relative to the C-shroud member 185 to control the flow of process gas through the vents 186. In some embodiments, the throttle member 196 is configured to engage with and/or enter the vents 186.

The upper wall 185C of the C-shroud member 185 is configured to support an upper electrode 187A/187B. In some embodiments, the upper electrode 187A/187B includes an inner upper electrode 187A and an outer upper electrode 187B. Alternatively, in some embodiments, the inner upper electrode 187A is present and the outer upper electrode 187B is not present, with the inner upper electrode 187A extending radially to cover the location that would be occupied by the outer upper electrode 187B. In some embodiments, the inner upper electrode 187A is formed of single crystal silicon and the outer upper electrode 187B is formed of polysilicon. However, in other embodiments, the inner upper electrode 187A and the outer upper electrode 187B can be formed of other materials that are structurally, chemically, electrically, and mechanically compatible with the processes to be performed within the plasma processing region 182. The inner upper electrode 187A includes a number of throughports 197 defined as holes extending through an entire vertical thickness of the inner upper electrode 187A. The throughports 197 are distributed across the inner upper electrode 187A, relative to the x-y plane, to provide for flow of process gas(es) from a plenum region 188 above the upper electrode 187A/187B to the plasma processing region 182 below the upper electrode 187A/187B.

It should be understood that the distribution of throughports 197 across the inner upper electrode 187A can be configured in different ways for different embodiments. For example, a total number of throughports 197 within the inner upper electrode 187A and/or a spatial distribution of throughports 197 within the inner upper electrode 187A can vary between different embodiments. Also, a diameter of the throughports 197 can vary between different embodiments. In general, it is of interest to reduce the diameter of the throughports 197 to a size small enough to prevent intrusion of the plasma 180 into the throughports 197 from the plasma processing region 182. In some embodiments, as the diameter of the throughports 197 is reduced, the total number of throughports 197 within the inner upper electrode 187A is increased to maintain a prescribed overall flowrate of process gas(es) from the process gas plenum region 188 through the inner upper electrode 187A to the plasma processing region 182. Also, in some embodiments, the upper electrode 187A/187B is electrically connected to a reference ground potential. However, in other embodiments, the inner upper electrode 187A and/or the outer upper electrode 187B is/are electrically connected to either a respective direct current (DC) electrical supply or a respective radiofrequency power supply by way of a corresponding impedance matching circuit.

The plenum region 188 is defined by an upper member 189. One or more gas supply ports 192 are formed through the chamber 101 and the upper member 189 to be in fluid communication with the plenum region 188. The one or more gas supply ports 192 are fluidly connected (plumbed) to a process gas supply system 191. The process gas supply system 191 includes one or process gas supplies, one or more mass flow controller(s), one or more flow control valve(s), among other devices, to provide controlled flow of one or more process gas(es) through the one or more gas supply ports 192 to the plenum region 188, as indicated by arrow 193. In some embodiments, the process gas supply system 191 also includes one or more components for controlling a temperature of the process gas(es). The process gas supply system 191 is connected to the control system 120 through one or more signal conductors 194.

A processing gap (g1) is defined as the vertical (z-direction) distance as measured between the top surface of the ceramic layer 110 and the bottom surface of the inner upper electrode 187A. The size of the processing gap (g1) can be adjusted by moving the cantilever arm assembly 115 in the vertical direction (z-direction). As the cantilever arm assembly 115 moves upward, the articulating outer support flange 171 eventually engages the lower wall 185A of the C-shroud member 185, at which point the articulating outer support flange 171 moves along the fixed outer support flange 169 as the cantilever arm assembly 115 continues to move upward until the set of support rods 201 engage the articulating outer support flange 171 and the prescribed processing gap (g1) size is achieved. Then, to reverse this movement for removal of the wafer W from the chamber, the cantilever arm assembly 115 is moved downward until the articulating outer support flange 171 moves away from the lower wall 185A of the C-shroud member 185. In various embodiments, the size of the processing gap (g1) during plasma processing of the wafer W is controlled with a range up to about 10 centimeters, or within a range up to about 8 centimeters, or within a range up to about 5 centimeters. It should be understood that FIG. 2 shows the system 100 in a closed configuration with the wafer W position on the ceramic layer 110 for plasma processing.

During plasma processing operations within the plasma processing system 100, the one or more process gas(es) are supplied to the plasma processing region 182 by way of the process gas supply system 191, plenum region 188, and throughports 197 within the inner upper electrode 187A. Also, radiofrequency signals are transmitted into the plasma processing region 182, by way of the first and second radiofrequency signal generators 147, 149, the impedance matching system 143, the radiofrequency signal supply rod 137, the radiofrequency signal supply shaft 141, the facilities plate 111, the electrode 109, and through the ceramic layer 110. The radiofrequency signals transform the process gas(es) into the plasma 180 within the plasma processing region 182. Ions and/or reactive constituents of the plasma interact with one or more materials on the wafer W to cause a change in composition and/or shape of particular material (s) present on the wafer W. The exhaust gases from the plasma processing region 182 flow through the vents 186 in the C-shroud member 185 and through the interior region 103 within the chamber 101 to the exhaust port 105 under the influence of a suction force applied at the exhaust port 105, as indicated by arrows 195.

In various embodiments, the electrode 109 can be configured to have different diameters. However, in some embodiments, to increase the surface of the electrode 109 upon which the edge ring 167 rests, the diameter of the electrode 109 is extended. In some embodiments, an electrically conductive gel 226 is disposed between a bottom of the edge ring 167 and the top of the electrode 109 and/or between the bottom of the edge ring 167 and the top of the coupling ring 161. In these embodiments, the increased diameter of the electrode 109 provides more surface area upon which the conductive gel is disposed between the edge ring 167 and the electrode 109.

It should be understood that the combination of the articulating outer support flange 171, the electrically conductive straps 173, and the fixed outer support flange 169 are electrically at a reference ground potential, and collectively form a ground return path for radiofrequency signals transmitted from the electrode 109 through the ceramic layer 110 into the plasma processing region 182. The azimuthal uniformity of this ground return path around the perimeter of the electrode 109 can have an effect on uniformity of process results on the wafer W. For example, in some embodiments, the uniformity of etch rate across the wafer W can be affected by the azimuthal uniformity of the ground return path around the perimeter of the electrode 109. To this end, it should be understood that the number, configuration, and arrangement of the electrically conductive straps 173 around the perimeter of the electrode 109 can affect the uniformity of process results across the wafer W.

With reference back to FIG. 2, a Tunable Edge Sheath (TES) system is implemented to include a TES electrode 415 disposed (embedded) within the coupling ring 161. The TES system also includes a number of TES radiofrequency signal supply pins 413 in physical and electrical connection with the TES electrode 415. Each TES radiofrequency signal supply pin 413 extends through a corresponding insulator feedthrough member 421 configured to electrically separate the TES radiofrequency signal supply pin 413 from surrounding structures, such as from the ceramic support 113 and the cantilever arm assembly 115 structure. In some embodiments, o-rings 417 and 419 are disposed to ensure that the region inside of the insulator feedthrough member 421 is not exposed to any materials/gases present within the plasma processing region 182. In some embodiments, the TES radiofrequency signal supply pins 413 are formed of copper, or aluminum, or anodized aluminum, among others.

The TES radiofrequency signal supply pins 413 extend into the open region 118 inside of the cantilever arm assembly 115, where each of the TES radiofrequency signal supply pins 413 is electrically connected to a TES radiofrequency signal supply conductor 409 through a corresponding TES radiofrequency signal filter 411. In some embodiments, three TES radiofrequency signal supply pins 413 are positioned to physically and electrically connect with the TES electrode 415 at substantially equally spaced azimuthal locations about the centerline of the electrode 109. It should be understood, however, that other embodiments can have more than three TES radiofrequency signal supply pins 413 in physical and electrical connection with the TES electrode 415. Also, some embodiments can have either one or two TES radiofrequency signal supply pins 413 in physical and electrical connection with the TES electrode 415. Each TES radiofrequency signal supply pin 413 is electrically connected to a corresponding TES radiofrequency signal filter 411, with each TES radiofrequency signal filter 411 electrically connected to the TES radiofrequency signal supply conductor 409. In some embodiments, each TES radiofrequency signal filter 411 is configured as an inductor. For example, in some embodiments, each TES radiofrequency signal filter 411 is configured as a coiled conductor, such as a metal coil wrapped around a dielectric core structure. In various embodiments, the metal coil can be formed of solid copper rod, copper tubing, aluminum rod, or aluminum tubing, among others. Also, in some embodiments, each TES radiofrequency signal filter 411 can be configured as a combination of inductive and capacitive structures. In the interest of improving plasma processing result uniformity across the wafer W, each of the TES radiofrequency signal filters 411 has a substantially same configuration.

In some embodiments, the TES radiofrequency signal supply conductor 409 is formed as a ring-shaped (annular-shaped) structure, so as to extend around the open region 118 inside of the cantilever arm assembly 115 to enable physical and electrical connection of the azimuthally distributed TES radiofrequency signal filters 411 with the TES radiofrequency signal supply conductor 409. In some embodiments, the TES radiofrequency signal supply conductor 409 is formed as a solid (non-tubular) structure. Alternatively, in some embodiments, the TES radiofrequency signal supply conductor 409 is formed as a tubular structure. In some embodiments, the TES radiofrequency signal supply conductor 409 is formed of copper, or aluminum, or anodized aluminum, among others.

The TES radiofrequency signal supply conductor 409 is electrically connected to a TES radiofrequency supply cable 407. Also, a capacitor 408 is connected between the TES radiofrequency signal supply conductor 409 and a reference ground potential, such as the structure of the cantilever arm assembly 115. More specifically, the capacitor 408 has a first terminal electrically connected to both the TES radiofrequency supply cable 407 and the TES radiofrequency signal supply conductor 409, and the capacitor 408 has a second terminal electrically connected to the reference ground potential. In some embodiments, the capacitor 408 is a variable capacitor. In some embodiments, the capacitor 408 is a fixed capacitor. In some embodiments, the capacitor 408 is set to have a capacitance within a range extending from about 10 picoFarads to about 100 picoFarads. The TES radiofrequency supply cable 407 is connected to a TES impedance matching system 401. The TES impedance matching system 401 is connected to a TES radiofrequency signal generator 403. Radiofrequency signals generated by the TES radiofrequency signal generator 403 are transmitted through the TES impedance matching system 401 to the TES radiofrequency supply cable 407, then to the TES radiofrequency signal supply conductor 409, then through the TES radiofrequency signal filters 411 to the respective TES radiofrequency signal supply pins 413, and to the TES electrode 415 within the coupling ring 161. In some embodiments, the TES radiofrequency signal generator 403 is configured and operated to generate radiofrequency signals within a frequency range extending from about 50 kiloHertz to about 27 MHz. In some embodiments, the TES radiofrequency signal generator 403 supplies radiofrequency power within a range extending from about 50 Watts to about 10 kiloWatts. The TES radiofrequency signal generator 403 is also connected to the control system 120 through one or more signal conductors 405.

The TES impedance matching system 401 includes an arrangement of inductors and capacitors sized and connected to provide for impedance matching so that radiofrequency power can be transmitted from the TES radiofrequency signal generator 403 along the TES radiofrequency supply cable 407, along the TES radiofrequency signal supply conductor 409, through the TES radiofrequency signal filters 411, through the respective TES radiofrequency signal supply pins 413, to the TES electrode 415 within the coupling ring 161, and into the plasma processing region 182 above the edge ring 167.

By transmitting radiofrequency signals/power through the TES electrode 415 disposed (embedded) within the coupling ring 161, the TES system is capable of controlling characteristics of the plasma 180 near the peripheral edge of the wafer W. For example, in some embodiments, the TES system is operated to control the plasma 180 sheath properties near the edge ring 167, such as by controlling a shape of the plasma 180 sheath and/or by controlling a size (either increase in sheath thickness or decrease in sheath thickness). Also, in some embodiments, by controlling the shape of the plasma 180 sheath near the edge ring 167, it is possible to control various properties of the bulk plasma 180 over the wafer W. Also, in some embodiments, the TES system is operated to control a density of the plasma 180 near the edge ring 167. For example, in some embodiments, the TES system is operated to either increase or decrease the density of the plasma 180 near the edge ring 167. Also, in some embodiments, the TES system is operated to control a bias voltage present on the edge ring 167, which in turn controls/influences movement of ions and other charged constituents within the plasma 180 near the edge ring 167. For example, in some embodiments, the TES system is operated to control a bias voltage present on the edge ring 167 to attract more ions from the plasma 180 toward the edge of the wafer W. And, in some embodiments, the TES system is operated to control a bias voltage present on the edge ring 167 to repel ions from the plasma 180 away from the edge of the wafer W. It should be understood that the TES system can be operated to perform a variety of different functions, such as those mentioned above, among others, either separately or in combination.

In some embodiments, the coupling ring 161 is formed of a dielectric material, such as quartz, or ceramic, or alumina ($Al_2O_3$), or a polymer, among others.

A bottom surface of the edge ring 167 has a portion that is coupled to the upper surface of the coupling ring 161 through a layer of thermally and electrically conductive gel to thermally sink the coupling ring 161 to the edge ring 167. Also, the bottom surface of the edge ring 167 has another portion that is coupled to an upper surface of the electrode 109 through a layer of thermally and electrically conductive gel. Examples of the thermally and electrically conductive gel include polyimide, polyketone, polyetherketone, polyether sulfone, polyethylene terephthalate, fluoroethylene propylene copolymers, cellulose, triacetates, and silicone, among others. In some embodiments, the thermally and electrically conductive gel is formed as a double-sided tape. In some embodiments, the edge ring 167 has an inner diameter sized to be proximate to the outer diameter of the ceramic layer 110.

In various embodiments, the TES electrode 415 is formed of an electrically conductive material, such as platinum, steel, aluminum, or copper, among others. During operation, capacitive coupling occurs between the TES electrode 415 and the edge ring 167, such that the edge ring 167 is electrically powered to influence processing of the wafer W near the outer perimeter of the wafer W.

Figure 3:
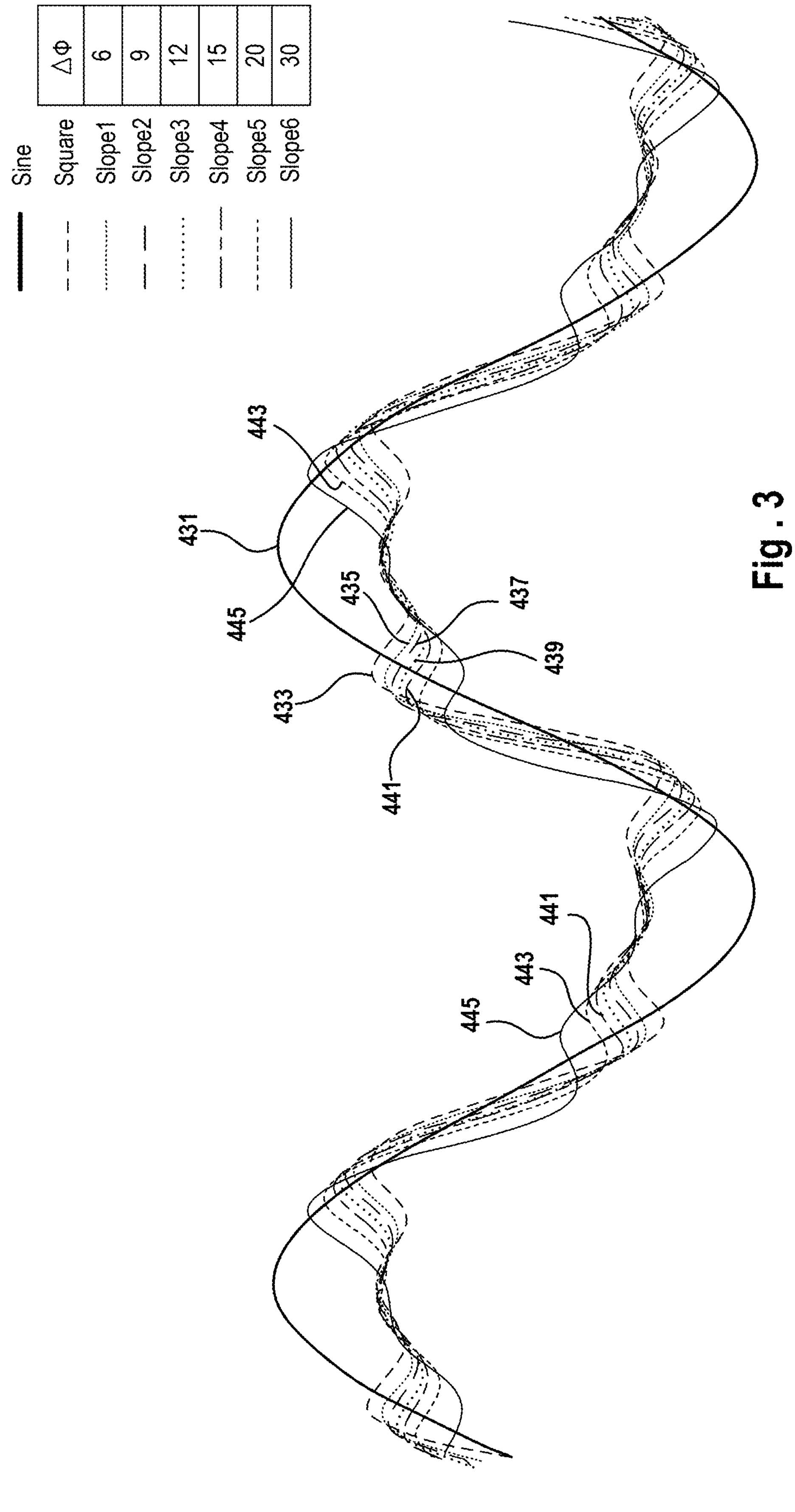
FIG. 3 conceptually illustrates various low frequency RF waveforms that approximate a sloped square waveform, in accordance with implementations of the disclosure.

FIG. 3 conceptually illustrates various low frequency RF waveforms that approximate a sloped square waveform, in accordance with implementations of the disclosure. In some implementations, multiple low frequency RF signals (e.g. at least three RF signals) are combined to generate, at least approximately, a sloped square waveform. The following description of the illustrated implementation is provided by way of example without limitation, in order to demonstrate principles of the present disclosure. A sloped square waveform will be understood to be a square wave whose peak and trough portions (or top and bottom portions, respectively) exhibit some non-zero slope, rather than having zero slope as in an ideal square wave. In some implementations, for a given sloped square wave provided in accordance with the principles of the present disclosure, the peak portions of the sloped square wave exhibit a positive/ascending slope, whereas the trough/bottom portions of the sloped square wave exhibit a negative/descending slope.

In the illustrated implementation, three harmonics are combined to approximate a sloped square waveform. The three harmonics include a fundamental frequency (first harmonic), the third harmonic frequency, and the fifth harmonic frequency. In the illustrated implementation, the power ratios of the first to third to fifth harmonic are approximately 0.8:0.15:0.05. However, in other implementations, the power ratios can vary. In some implementations, the fundamental frequency is at 400 kHz, and consequently, the third harmonic has a frequency of 1.2 MHz, and the fifth harmonic has a frequency of 2 MHz. However, in other implementations, the frequencies can differ.

A pure sinusoidal waveform is illustrated by the signal 431, which can be represented by the following equation:

$$Y = \sin(\varphi)$$

A square wave is approximated by the addition of the third and fifth harmonics, illustrated by the signal 433, which is represented by the following equation:

$$Y = A*\sin(\varphi) + B*\sin(3*\varphi) + C*(5*\varphi),$$

where A, B, and C are the weights (fractional power ratios) of the fundamental frequency, third harmonic, and fifth harmonic, which sum to one (A+B+C=1). For example, in some implementations (approximately) A=0.8, B=0.15, and C=0.05.

In order to achieve a sloped square waveform, the phases of the harmonics are adjusted relative to the fundamental frequency. Accordingly, sloped square waveforms are produced by phase adjustment of the harmonics represented by equations of the following form:

$$Y = A*\sin(\varphi) + B*\sin(3*\varphi - (360 - 3\Delta\varphi)) + C*(5*\varphi - (360 - 5\Delta\varphi))$$

where Δφ is the phase adjustment (or phase change) in degrees.

Various examples of waveforms generated using different values for Δφ are shown in the illustrated implementation. As can be seen, as the Δφ increases, so does the amount of sloping of the resulting waveform, which changes from an approximately square wave at Δφ=0, to increasing sloped square waves as Δφ increases. In the illustrated implementation, signals 435, 437, 439, 441, 443, and 445 demonstrate the resulting waveforms when Δφ=6, 9, 12, 15, 20, and 30 degrees, respectively, and (approximately) A=0.8, B=0.15, and C=0.05.

It will be appreciated that though specific values are described, such values are provided by way of example without limitation, to demonstrate the principles of the present disclosure. For example, in some implementations, the phase adjustment Δφ is in the range of approximately 3 to 15 degrees; in some implementations, approximately 6 to 12 degrees; in some implementations, approximately 8 to 10 degrees. In some implementations the weight A is approximately in the range of 0.7 to 0.9, the weight B is approximately in the range of 0.1 to 0.2, the weight C is approximately in the range of 0.02 to 0.1.

In the above-described implementation, three harmonics have been combined to form the low frequency RF signal. However, in other implementations, more than three harmonics can be combined to form the low frequency RF signal. In general, a higher number of harmonics enables better approximation of square and sloped square waveforms. Moreover, by mixing odd harmonics, the resulting waveform will have symmetric positive and negative halves; whereas by mixing odd and even harmonics, it becomes possible to change the distribution of the positive and negative halves of the waveform. For example, in some implementations even and odd harmonics are mixed so as to provide a waveform wherein the negative half of the waveform is lengthened while the positive half of the waveform is shortened.

Figure 4:
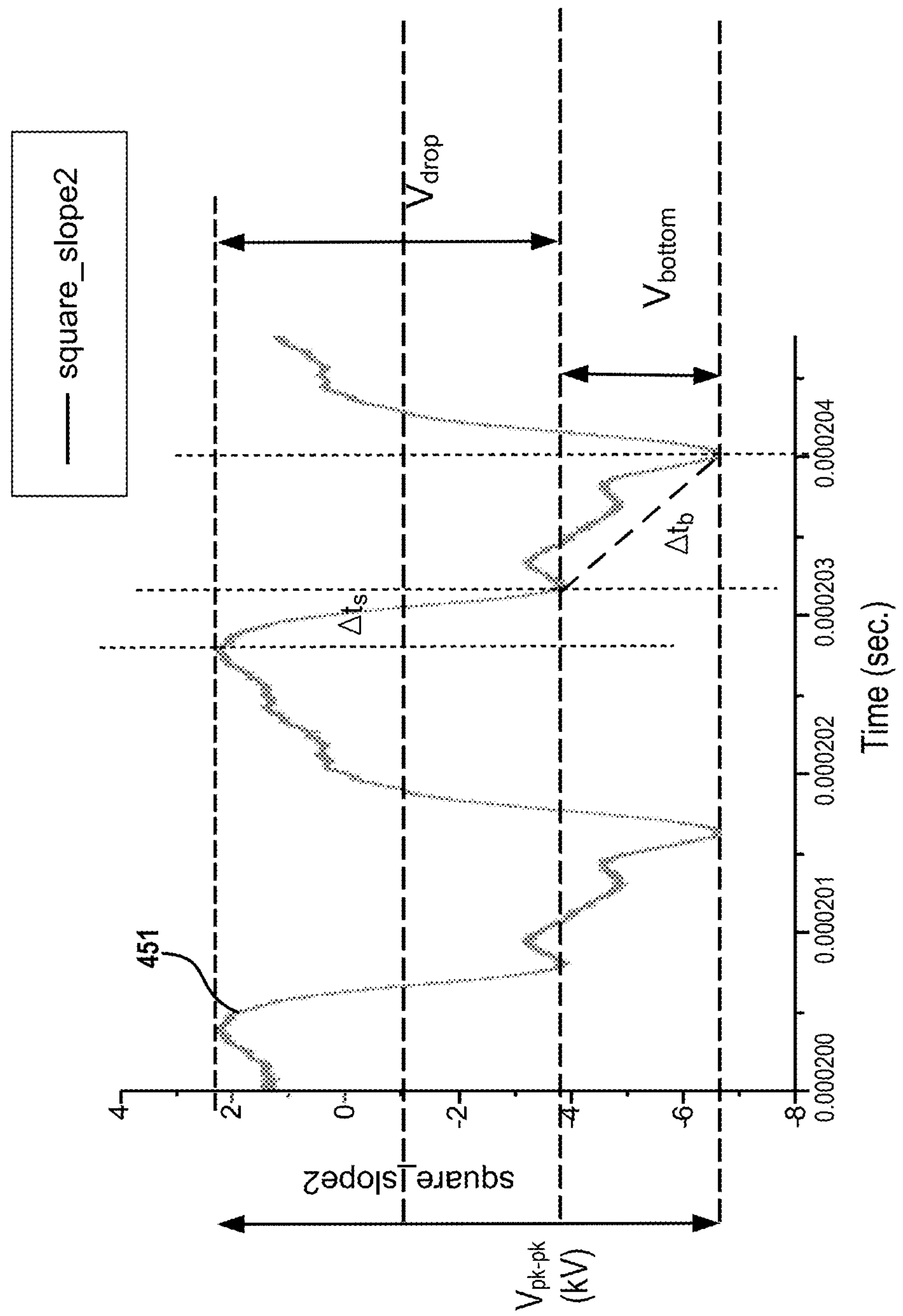
FIG. 4 conceptually illustrates various metrics to quantify a low frequency RF signal having a sloped square waveform, in accordance with implementations of the disclosure.

FIG. 4 conceptually illustrates various metrics to quantify a low frequency RF signal having a sloped square waveform, in accordance with implementations of the disclosure. In the illustrated implementation, a low frequency RF signal 451 having a sloped square waveform is shown. The sloped square waveform of the low frequency RF signal 451 is achieved in accordance with the implementations described above, more specifically, by combining sinusoidal harmonics to generate the desired waveform.

Total peak to peak voltage drop of the signal during one cycle is shown by $V_{pk-pk}$. However, as it is believed that the bottom portion of the waveform (during $\Delta t_b$) is compensating for charging of the capacitance of the ESC, then the maximum ion energy is approximately determined by the voltage drop from the initial upper peak to the first intermediate peak, which is shown by the voltage drop $V_{drop}$. (It will be appreciated that for pure (ideal) sinusoidal and square (non-sloped) waveforms, $V_{pk-pk}=V_{drop}$, and there is no separate bottom slope.)

The amount of intermediate ion energies generated is largely determined by the extent to which voltages between the initial upper peak and the first intermediate peak are provided, which is a function of the amount of time required for $V_{drop}$. In other words, an approximate metric for the amount of intermediate ion energy is the slope of the initial voltage drop which is represented as $V_{drop}/\Delta t_s$. The steeper the slope $V_{drop}/\Delta t_s$, then the less intermediate ion energies will be generated; whereas the shallower the slope, then the more that intermediate ion energies will be generated.

The bottom portion of the signal exhibits a sloping that is believed to compensate for charging of the capacitance of the ESC, and therefore exhibits a voltage drop $V_{bottom}$. The slope of the bottom portion, V bottom/$\Delta t_b$, is thus indicative of the extent of charge compensation produced by the waveform.

As has been described, but without being bound by a particular theory of operation, the charging of the capacitance of the ESC causes a flat/constant potential applied at the RF rod to exhibit a reduction over time when measured at the wafer. Thus, for example, the flat bottom portion of a square wave applied at the RF signal supply rod 137 will produce a diminishing potential at the wafer, as the potential of the RF signal that reaches the wafer is diminished over the course of the RF cycle due to the charging of the ESC capacitance. In order to compensate for this effect, the sloping of the bottom portion of the RF signal 451 is configured to increase over the time $\Delta t_b$ the potential applied at the RF signal supply rod 137, so that the resulting potential at the wafer remains approximately constant during this portion of the RF signal cycle. When the sloping of the bottom portion of the RF signal is optimally tuned to provide such a constant potential at the wafer surface, then the ion energy distribution function is better optimized to provide a narrow distribution at high ion energies, as the ions are accelerated by a sustained substantially constant potential difference between the wafer surface and the plasma.

Thus, it is believed that the sloped square shape of the waveform compensates for the "charging of the capacitor" effect, providing for a flat potential on the wafer that enables an optimized ion energy distribution function (IEDF), e.g. with primarily two basic peaks, one high, one low, and substantially devoid of intermediate energies. With an optimized IEDF, the angular distribution function also becomes much tighter, for instead of intermediate ion energies, most ions are propelled at high energy, and the angular distribution function becomes narrower at higher ion energies, as high energy ions are less prone to scattering. With a narrow ion energy distribution function, fewer ions will hit sidewalls during etching, as the ions are more directional and will hit the bottom of etched features more. Thus, by optimizing the IEDF, a more focused angular distribution function is achieved, and better directional etch is further achieved which enables improved verticality of etching of high aspect ratio features.

In accordance with the above, harmonics can be added to change a fundamental low frequency RF waveform from a sinusoidal to a square shape. Then the addition of phase changes can be implemented to change the waveform from a square shape to a sloped square shape.

Figure 5:
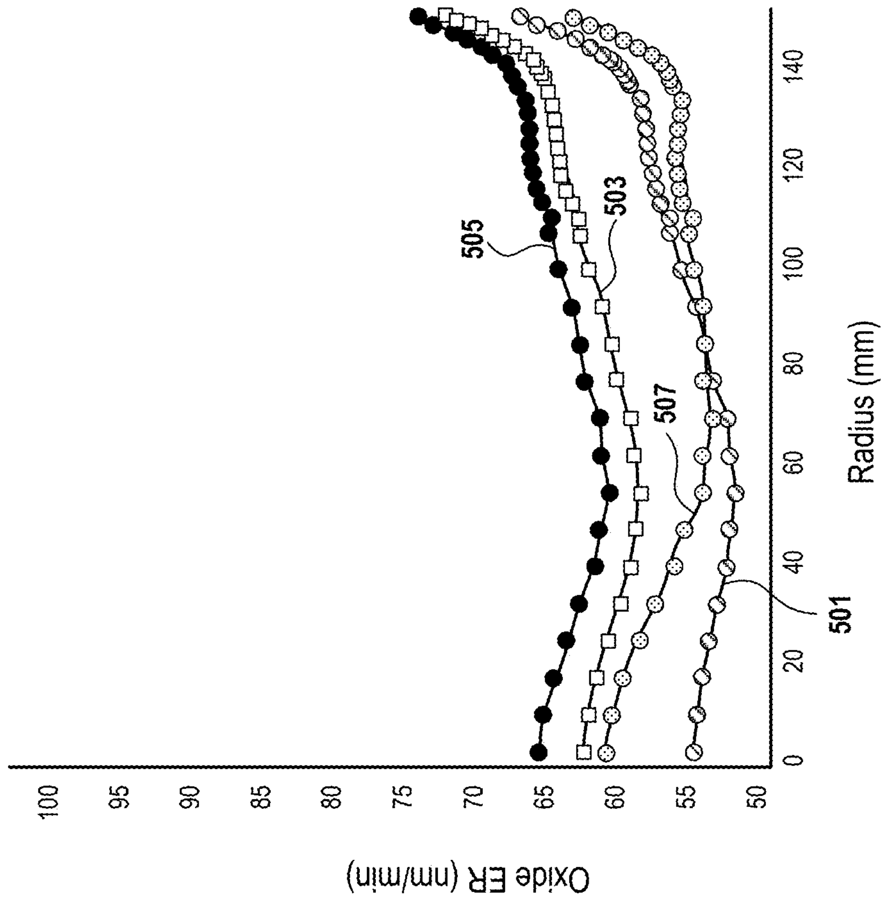
FIG. 5 is a graph conceptually showing etch rate versus radius for various waveforms on a blanket wafer, in accordance with implementations of the disclosure.

FIG. 5 is a graph conceptually showing etch rate versus radius for various waveforms on a blanket wafer, in accordance with implementations of the disclosure. The curve 501 illustrates the etch rate for a simple sinusoidal waveform, whereas the curve 503 illustrates the etch rate for a square waveform. As shown, the sinusoidal wave form provides the lowest etch rate, whereas the square waveform provides an increased etch rate.

The etch rate can be even further increased by adjusting the slope, as demonstrated by the curve 505, which shows the results for an optimized sloped square waveform. This achieves the highest etch rate, as the slope has been adjusted to provide compensation for the capacitance of the chuck, and thereby provide an optimized IEDF.

However, too much adjustment of the slope can lower the etch rate, as demonstrated by the curve 507, which shows the results for a sloped square waveform with a greater slope than that of the curve 505. In this case, too much slope has reduced the etch rate results to be lower than those of the square waveform shown by curve 503.

Figure 6A:
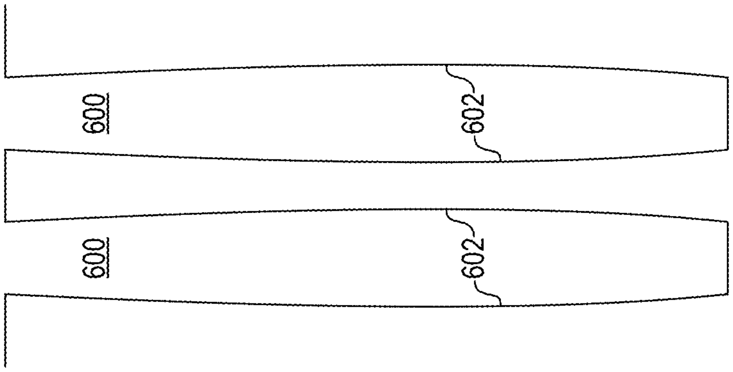
FIGS. 6A, 6B, and 6C conceptually illustrate bowing present in features etched using different waveforms, in accordance with implementations of the disclosure.
Figure 6B:
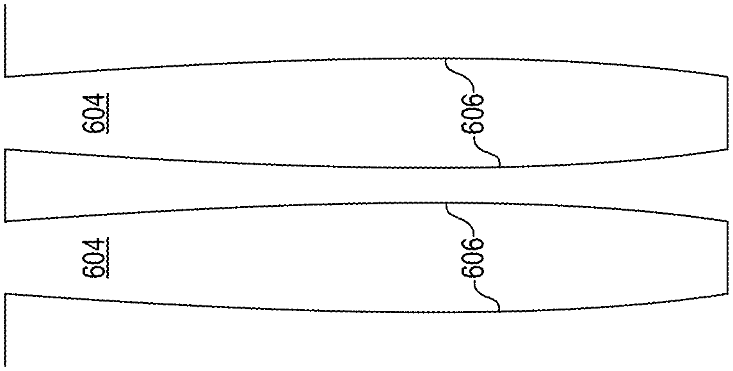
Figure 6C:
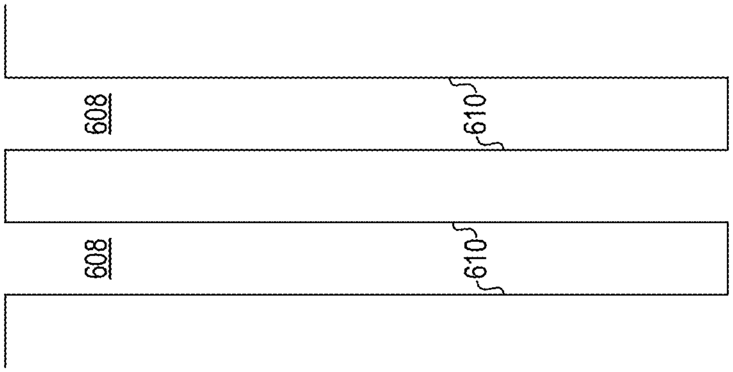

FIGS. 6A, 6B, and 6C conceptually illustrate bowing present in features etched using different waveforms, in accordance with implementations of the disclosure. As has been noted, by optimizing the waveform to compensate for capacitance charging, which tends to reduce the potential at the wafer, then it is possible to achieve a narrower IEDF with a predominance of high energy ions. This provides for improved directionality of the ions, as the ions are less likely to scatter and etch the sidewalls of features (producing unwanted "bowing" of the sidewalls). And hence, improved anisotropic etching is achieved, which is critical for etching high aspect ratio features. In some implementations, high aspect ratio features are defined as features with a depth-to-width aspect ratio of approximately 25:1 or greater. In some implementations, a high aspect ratio is defined as 30, 40, 50, or 60 to one or greater.

FIG. 6A conceptually illustrates a cross-section of a portion of a wafer showing features etched using a sine-shaped low frequency RF waveform. As shown, the features 600 exhibit bowing of their sidewalls 602, due to the IEDF not being optimized, such that a significant number of intermediate energy ions are produced. This causes the angular distribution of the ions to be more diffuse and produces bowing as shown.

FIG. 6B conceptually illustrates a cross-section of a portion of a wafer showing features etched using a square-shaped low frequency RF waveform (without sloping). As shown, the features 604 exhibit even more significant bowing of their sidewalls 606 than was the case with the sine-shaped waveform. While the square-shaped waveform provides for increased etch rate over that of the sine-shaped waveform as described above, the square-shaped waveform does not compensate for the charging of the capacitance of the ESC, and actually worsens the bowing in the etched features.

FIG. 6C conceptually illustrates a cross-section of a portion of a wafer showing features etched using a sloped square-shaped low frequency RF waveform. More specifically, the sloping of the square-shaped waveform has been tuned to compensate for the charging of the capacitance of the ESC, providing a much more concentrated high energy IEDF, and narrower ion angular distribution. As a result, the features 608 exhibit significantly reduced bowing of their sidewalls 610 as compared to either of the sine-shaped and square-shaped waveform scenarios.

Broadly speaking, implementations of the present disclosure are drawn to providing an optimized low frequency RF waveform, which is capable of compensating for the capacitance of the ESC. It should be appreciated that the various parameters of the waveform are also important in combination for achieving an optimized IEDF.

In general, at least three different low frequency waveforms are generated and combined to generate a square wave, and the phases of the waveforms are adjusted relative to each other in order to adjust the slope of the square wave to achieve a sloped square wave shape. In some implementations, the frequencies utilized consist of a fundamental frequency and at least two harmonics of the fundamental. To achieve an optimized shape, at least three frequencies and a proper phase relationship are implemented, to achieve a narrow ion angular distribution function and improved verticality of etching of high aspect ratio features.

In some implementations, more than three different frequencies are combined (e.g. 4, 5, 6, etc.).

In some implementations, different frequencies are combined, including a fundamental frequency and a combination of odd or even harmonics, or mixtures thereof.

Obtaining an ion source with a narrow IEDF has been challenging for applications such as high aspect ratio etch due to the significantly higher voltage required than for other applications. It will be appreciated that the voltage is dependent on the weights of the fundamental and the harmonics, and thus the weights of the fundamental and harmonics are tuned to provide high voltage in accordance with implementations of the disclosure.

In some implementations, the voltage is heavily dependent on the first fundamental frequency which creates fundamental voltages in the plasma, such that the fundamental frequency largely determines the highest voltage of the final RF signal. Generally, in some implementations, for a given power output, frequency is inversely correlated to voltage, so that lower frequencies give higher voltages, and higher frequencies give lower voltages. For example, at a power output of about 15 kW and a fundamental frequency of about 400 kHz, voltages in the range of about 10 to 11 kV peak-to-peak are achieved.

Following then from the chosen fundamental frequency, the weights and phases of the harmonics can be tuned to optimize the shape of the overall waveform, as discussed.

It will be appreciated that both the frequency and the waveform shape in combination are important for achieving a narrow IEDF. For the ion angular distribution depends on the manner in which ions in the plasma sheath are accelerated. As the plasma sheath has certain a width, and the ions have certain velocities, they may respond differently to different frequencies. Hence achieving an optimal narrow IEDF is challenging and dependent on a combination of frequency and waveform shape.

Figure 7:
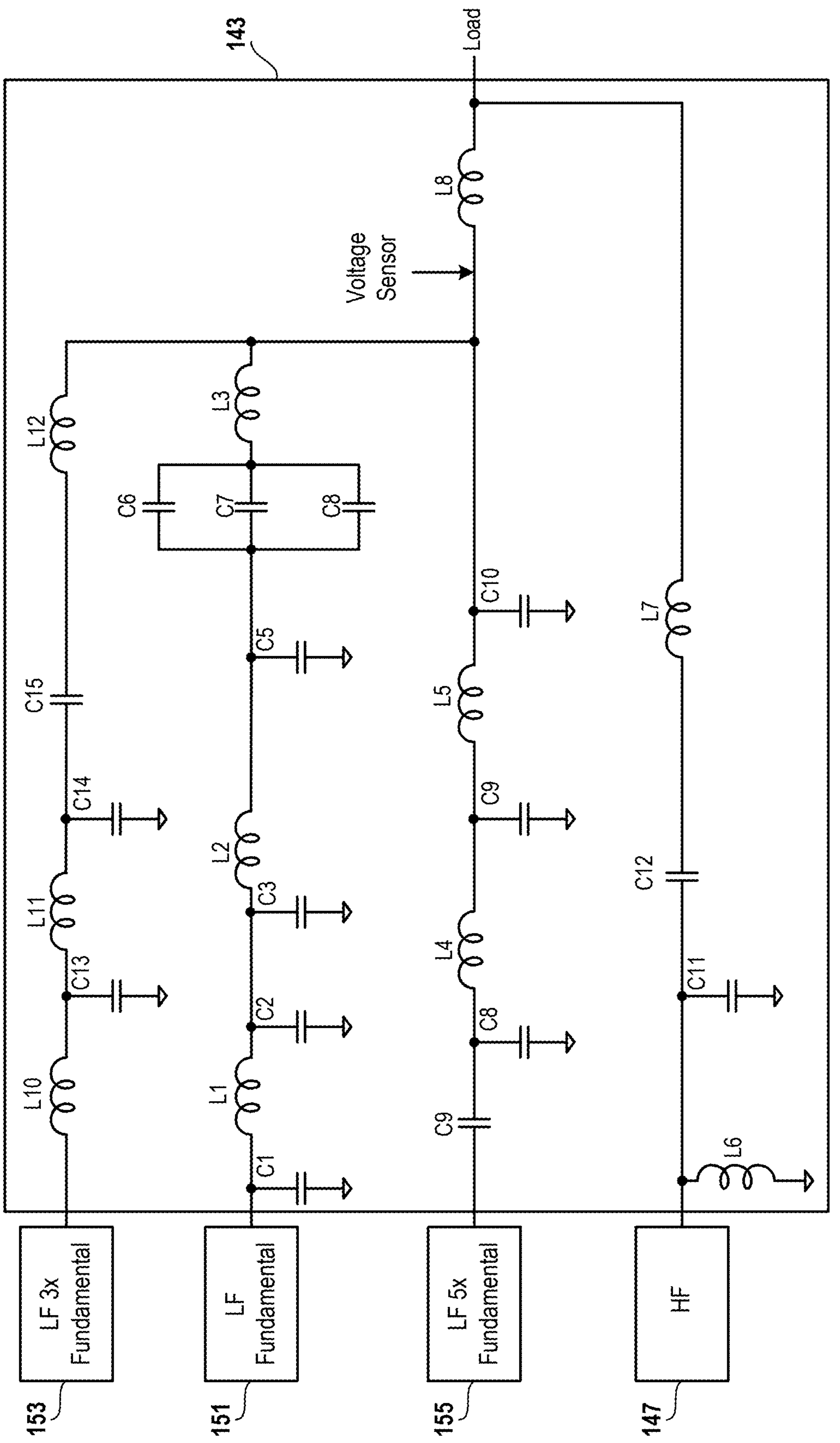
FIG. 7 shows an example electrical schematic of an impedance matching system, in accordance with some embodiments.

FIG. 7 shows an example electrical schematic of an impedance matching system, in accordance with some embodiments. Componentry of the impedance matching system 143 in accordance with implementations of the disclosure is shown. As shown, the impedance matching system 143 is configured to handle the separately generated RF signals from the RF signal generators 151, 153, and 155, which are combined to generate a substantially or approximately sloped-square waveform as described in accordance with implementations of the disclosure.

It will be appreciated that any of the methods described in the present disclosure can be implemented to run automatically by the control system 120. In some embodiments, parameters for generating the low frequency RF signal in accordance with implementations of the disclosure are editable through a user interface.

Figure 8:
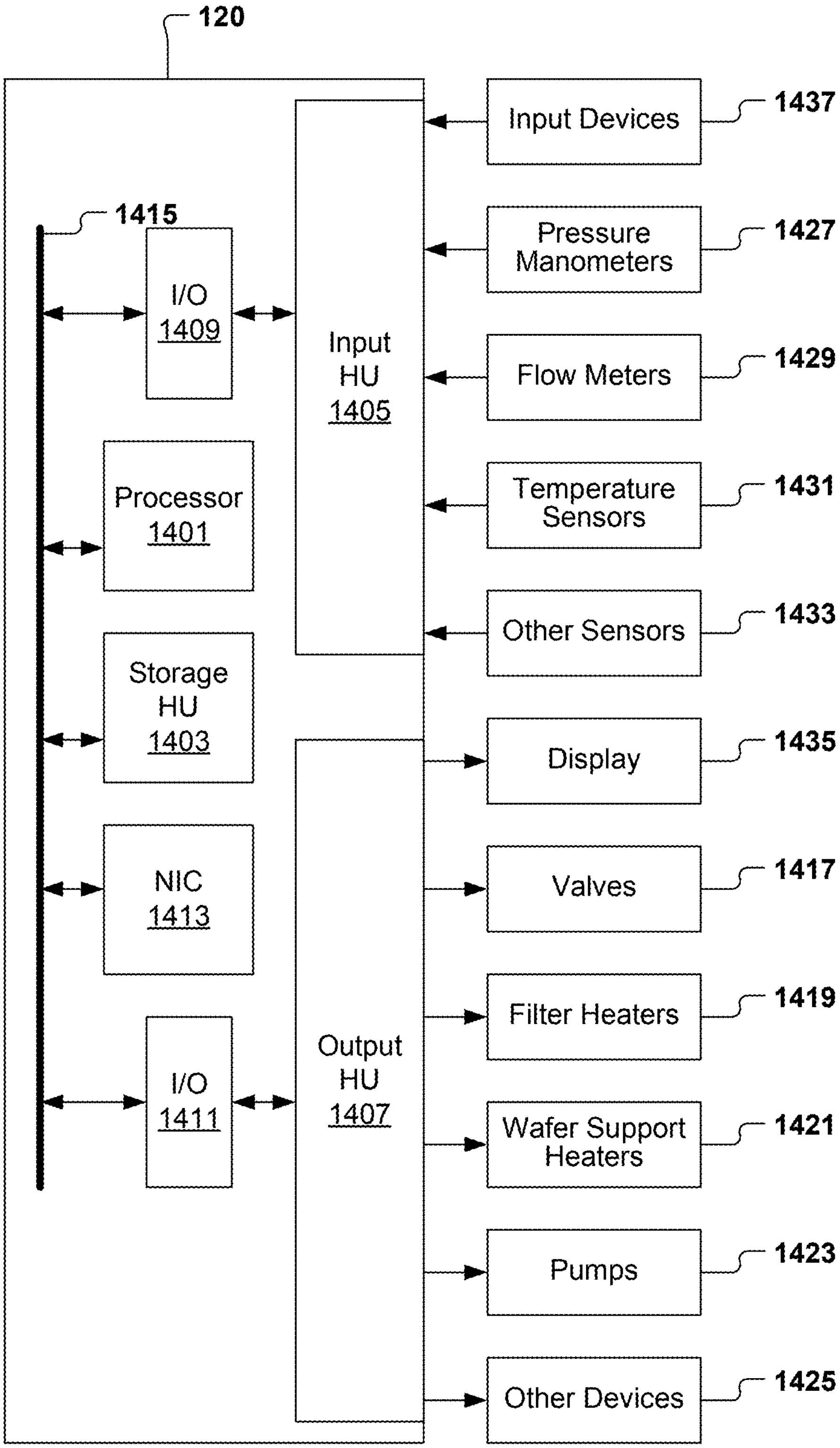
FIG. 8 shows an example schematic of the control system of FIG. 2, in accordance with some embodiments.

FIG. 8 shows an example schematic of the control system 120 of FIG. 2, in accordance with some embodiments. In some embodiments, the control system 120 is configured as a process controller for controlling the semiconductor fabrication process performed in plasma processing system 100. In various embodiments, the control system 120 includes a processor 1401, a storage hardware unit (HU) 1403 (e.g., memory), an input HU 1405, an output HU 1407, an input/output (I/O) interface 1409, an I/O interface 1411, a network interface controller (NIC) 1413, and a data communication bus 1415. The processor 1401, the storage HU 1403, the input HU 1405, the output HU 1407, the I/O interface 1409, the I/O interface 1411, and the NIC 1413 are in data communication with each other by way of the data communication bus 1415. The input HU 1405 is configured to receive data communication from a number of external devices. Examples of the input HU 1405 include a data acquisition system, a data acquisition card, etc. The output HU 1407 is configured to transmit data to a number of external devices. An example of the output HU 1407 is a device controller. Examples of the NIC 1413 include a network interface card, a network adapter, etc. Each of the I/O interfaces 1409 and 1411 is defined to provide compatibility between different hardware units coupled to the I/O interface. For example, the I/O interface 1409 can be defined to convert a signal received from the input HU 1405 into a form, amplitude, and/or speed compatible with the data communication bus 1415. Also, the I/O interface 1407 can be defined to convert a signal received from the data communication bus 1415 into a form, amplitude, and/or speed compatible with the output HU 1407. Although various operations are described herein as being performed by the processor 1401 of the control system 120, it should be understood that in some embodiments various operations can be performed by multiple processors of the control system 120 and/or by multiple processors of multiple computing systems in data communication with the control system 120.

In some embodiments, the control system 120 is employed to control devices in various wafer fabrication systems based in-part on sensed values. For example, the control system 120 may control one or more of valves 1417, filter heaters 1419, wafer support structure heaters 1421, pumps 1423, and other devices 1425 based on the sensed values and other control parameters. The valves 1417 can include valves associated with control of the backside gas supply system 129, the process gas supply system 191, and the temperature control fluid circulation system 125. The control system 120 receives the sensed values from, for example, pressure manometers 1427, flow meters 1429, temperature sensors 1431, and/or other sensors 1433, e.g., voltage sensors, current sensors, etc. The control system 120 may also be employed to control process conditions within the plasma processing system 100 during performance of plasma processing operations on the wafer W. For example, the control system 120 can control the type and amounts of process gas(es) supplied from the process gas supply system 191 to the plasma processing region 182. Also, the control system 120 can control operation of the first radiofrequency signal generator 147, the low frequency RF subsystem 149, the impedance matching system 143, the TES radiofrequency signal generator 403, and the TES impedance matching system 401. Also, the control system 120 can control operation of the DC supply 117 for the clamping electrode(s) 112. The control system 120 can also control operation of the lifting devices 133 for the lift pins 132 and operation of the door 107. The control system 120 also controls operation of the backside gas supply system 129 and the temperature control fluid circulation system 125. The control system 120 also control vertical movement of the cantilever arm assembly 115. The control system 120 also controls operation of the throttle member 196 and the pump that controls suction at the exhaust port 105. The control system 120 also controls operation of the hold-down control mechanisms 913 of the hold-down rods 911 of the TES system 1000. The control system 120 also receives input from the temperature probe of the TES system 1000. It should be understood that the control system 120 is equipped to provide for programmed and/or manual control any function within the plasma processing system 100.

In some embodiments, the control system 120 is configured to execute computer programs including sets of instructions for controlling process timing, process gas delivery system temperature, and pressure differentials, valve positions, mixture of process gases, process gas flow rate, backside cooling gas flow rate, chamber pressure, chamber temperature, wafer support structure temperature (wafer temperature), RF power levels, RF frequencies, RF pulsing, impedance matching system 143 settings, cantilever arm assembly position, bias power, and other parameters of a particular process. Other computer programs stored on memory devices associated with the control system 120 may be employed in some embodiments. In some embodiments, there is a user interface associated with the control system 120. The user interface include a display 1435 (e.g., a display screen and/or graphical software displays of the apparatus and/or process conditions), and user input devices 1437 such as pointing devices, keyboards, touch screens, microphones, etc.

Software for directing operation of the control system 120 may be designed or configured in many different ways. Computer programs for directing operation of the control system 120 to execute various wafer fabrication processes in a process sequence can be written in any conventional computer readable programming language: for example, assembly language, C, C++, Pascal, Fortran or others. Compiled object code or script is executed by the processor 1401 to perform the tasks identified in the program. The control system 120 can be programmed to control various process control parameters related to process conditions such as, for example, filter pressure differentials, process gas composition and flow rates, backside cooling gas composition and flow rates, temperature, pressure, plasma conditions, such as RF power levels and RF frequencies, bias voltage, cooling gas/fluid pressure, and chamber wall temperature, among others. Examples of sensors that may be monitored during the wafer fabrication process include, but are not limited to, mass flow control modules, pressure sensors, such as the pressure manometers 1427 and the temperature sensors 1431. Appropriately programmed feedback and control algorithms may be used with data from these sensors to control/adjust one or more process control parameters to maintain desired process conditions.

In some implementations, the control system 120 is part of a broader fabrication control system. Such fabrication control systems can include semiconductor processing equipment, including a processing tools, chambers, and/or platforms for wafer processing, and/or specific processing components, such as a wafer pedestal, a gas flow system, etc. These fabrication control systems may be integrated with electronics for controlling their operation before, during, and after processing of the wafer. The control system 120 may control various components or subparts of the fabrication control system. The control system 120, depending on the wafer processing requirements, may be programmed to control any of the processes disclosed herein, including the delivery of processing gases, the delivery of backside cooling gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the control system 120 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the control system 120 in the form of various individual settings (or program files), defining operational parameters for carrying out a particular process on the wafer W within system 100. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The control system 120, in some implementations, may be a part of or coupled to a computer that is integrated with, coupled to the plasma processing system 100, or otherwise networked to the system 100, or a combination thereof. For example, the control system 120 may be in the "cloud" of all or a part of a fab host computer system, which can allow for remote access of the wafer processing. The computer may enable remote access to the system 100 to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to the system 100 over a network, which may include a local network or the Internet.

The remote computer may include a user interface that enables entry or programming of parameters and/or settings, which are then communicated to the system 100 from the remote computer. In some examples, the control system 120 receives instructions in the form of data, which specify parameters for each of the processing steps to be performed during one or more operations. It should be understood that the parameters may be specific to the type of process to be performed within the plasma processing system 100. Thus as described above, the control system 120 may be distributed, such as by comprising one or more discrete controllers that are networked together and working towards a common purpose, such as the processes and controls described herein. An example of a distributed controller for such purposes would be one or more integrated circuits on the plasma processing system 100 in communication with one or more integrated circuits located remotely (such as at the platform level or as part of a remote computer) that combine to control a process performed on the plasma processing system 100.

Without limitation, example systems that the control system 120 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the control system 120 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be implemented in conjunction with various computer system configurations including hand-held hardware units, microprocessor systems, microprocessor-based or programmable consumer electronics, minicomputers, mainframe computers and the like. Embodiments described herein can also be implemented in conjunction with distributed computing environments where tasks are performed by remote processing hardware units that are linked through a network. It should be understood that the embodiments described herein, particularly those associated with the control system 120, can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general-purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be implemented through process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

The invention claimed is:

1. A system for applying radio frequency (RF) power to a chuck in a plasma process chamber, comprising:

a RF signal generator subsystem with a plurality of RF generators configured to generate a plurality of RF signals of low frequencies that are distinctly different from one another, the plurality of RF signals includes a primary RF signal and a plurality of secondary RF signals, each secondary RF signal of the plurality of secondary RF signals generated by adjusting a phase of the respective secondary RF signal relative to a primary phase of the primary RF signal; and an impedance matching circuit to combine the plurality of RF signals to generate a combined RF signal for applying to the chuck, the combined RF signal configured to have a wave shape that approximates a sloped square wave shape, the sloped square wave shape configured to compensate for capacitance of the chuck.

2. The system of claim 1, wherein the plurality of low frequency RF generators includes at least 3 RF signal generators, wherein each RF signal generator generating a corresponding low frequency RF signal.

3. The system of claim 1, wherein one or more of the plurality of RF signals generated by the plurality of low frequency RF generators is a sinusoidal RF signal.

4. The system of claim 1, wherein the RF signal generator subsystem includes, a first RF generator configured to generate the primary RF signal;

a second RF generator configured to generate a second RF signal; and a third RF generator configured to generate a third RF signal, wherein the primary RF signal, the first RF signal, and the second RF signal are generated with distinct frequencies.

5. The system of claim 4, wherein the first RF generator is configured to generate the primary RF signal at a fundamental frequency, wherein the second RF generator is configured to generate the second RF signal at a first predefined harmonic frequency of the fundamental frequency, and wherein the third RF generator is configured to generate the third RF signal at a second predefined harmonic frequency of the fundamental frequency, and wherein the first predefined harmonic frequency is different from the second predefined harmonic frequency.

6. The system of claim 5, wherein the first predefined harmonic frequency is one of an even and odd harmonic frequency of the fundamental frequency.

7. The system of claim 5, wherein the second predefined harmonic frequency is one of an even and odd harmonic frequency of the fundamental frequency.

8. The system of claim 5, wherein each of the second and third RF generators is configured to individually adjust a phase of the second RF signal and the third RF signal, respectively, so as to adjust a slope of the sloped square waveform.

9. The system of claim 8, wherein the phase of the first predefined harmonic frequency of the second RF signal and the phase of the second predefined harmonic frequency of the third RF signal are adjusted relative to the fundamental frequency, so as to define a phase offset of each of the first predefined harmonic frequency and the second predefined harmonic frequency leading to adjustment to the sloped square waveform when the first, the second and the third RF signals are combined.

10. The system of claim 8, wherein weights and the phases of the first predefined harmonic frequency of the second RF signal and the second predefined harmonic frequency of the third RF signal are adjusted in accordance to a phase and a weight of the fundamental frequency of the primary RF signal.

11. The system of claim 1, wherein the plurality of secondary RF signals includes at least a first set of odd RF signals and a second set of even RF signals, wherein each odd RF signal in the first set is generated at a distinct predefined odd hormonic frequency, and wherein each even RF signal in the second set is generated at a distinct predefined even harmonic frequency, and wherein the impedance matching circuit is configured to generate the combined RF signal by combining, (a) the primary RF signal with the first set of odd RF signals, or (b) the primary RF signal with the second set of even RF signals, or (c) the primary RF signal with a mixture of select ones of the first set of odd RF signals, or select ones of the second set of even RF signals, or a mixture of the select ones of the first set of odd RF signals and the second set of even RF signals.

12. The system of claim 1, wherein the RF signal generator subsystem is configured to generate the primary RF signal and the plurality of secondary RF signals at a frequency in the range of between about 50 kHz and about 500 kHz.

13. The system of claim 1, wherein the wave shape of the combined RF signal is configured so that peak portions of the wave shape exhibit a positive slope and trough portions of the wave shape exhibit a negative slope.

14. The system of claim 1, wherein the wave shape of the combined RF signal is configured to ensure verticality of high aspect ratio features during etching.

15. A system for applying radio frequency (RF) power to a chuck in a plasma process chamber, comprising:

a RF signal generator subsystem having, a primary RF generator to generate a primary RF signal, and a plurality of secondary RF generators to generate a plurality of secondary RF signals, wherein each of the plurality of secondary RF generators is configured to generate a respective secondary RF signal of a distinct frequency by adjusting a phase of the respective secondary RF signal relative to a primary phase of the primary RF signal, and wherein the RF signal generator subsystem is configured to combine the primary RF signal and the plurality of secondary RF signals to generate a combined RF signal, such that a wave shape of the combined RF signal is configured to approximate a sloped square wave shape, the sloped square wave shape configured to compensate for capacitance of the chuck, the adjusting of the phase of the respective secondary RF signal causing an adjustment to an amount of sloping of the wave shape of the combined RF signal.

16. The system of claim 15, wherein the plurality of secondary RF generators includes, a first secondary RF generator that generates a first secondary RF signal of the plurality of secondary RF signals;

a second secondary RF generator that generates a second secondary RF signal of the plurality of secondary RF signals;

wherein the first and the second secondary RF signals are generated at different frequencies from one another and from the primary RF signal, the combined RF signal is configured to be applied to the chuck in the plasma process chamber.

17. The system of claim 16, wherein the primary RF signal is generated at a fundamental frequency;

wherein the first secondary RF signal is generated at a first predefined harmonic frequency of the fundamental frequency; and wherein the second secondary RF signal is generated at a second predefined harmonic frequency of the fundamental frequency.

18. The system of claim 17, wherein the first or the second predefined harmonic frequency is an even or odd harmonic of the fundamental frequency.

19. The system of claim 15, wherein the wave shape of the combined RF signal is configured so that peak portions of the wave shape exhibit a positive slope and trough portions of the wave shape exhibit a negative slope.

* * * * *